United States Patent [19]
Kindred et al.

[11] Patent Number: 5,710,784
[45] Date of Patent: Jan. 20, 1998

[54] MULTIRATE SERIAL VITERBI DECODER FOR CODE DIVISION MULTIPLE ACCESS SYSTEM APPLICATIONS

[75] Inventors: Daniel Ray Kindred; Brian K. Butler, both of San Diego; Ephraim Zehavi, Del Mar; Jack Keil Wolf, La Jolla, all of Calif.

[73] Assignee: Qualcomm Incorporated, San Diego, Calif.

[21] Appl. No.: 728,101

[22] Filed: Oct. 9, 1996

Related U.S. Application Data

[63] Continuation of Ser. No. 126,477, Sep. 24, 1993, abandoned.

[51] Int. Cl.$^6$ ............................................. G06F 11/10
[52] U.S. Cl. ............................................. 371/43; 375/262
[58] Field of Search .................... 371/30, 41, 43–46, 371/37.1; 375/259, 260, 261, 262, 263, 264, 265

[56] References Cited

U.S. PATENT DOCUMENTS

| | | | |
|---|---|---|---|
| 4,748,626 | 5/1988 | Wong | 371/43 |
| 4,845,714 | 7/1989 | Zook | 371/37.1 |
| 5,023,889 | 6/1991 | Divsalar et al. | 371/43 |
| 5,056,117 | 10/1991 | Gitlin et al. | 371/43 |
| 5,416,787 | 5/1995 | Kodama et al. | 371/43 |

*Primary Examiner*—Reba I. Elmore
*Assistant Examiner*—Thomas E Brown
*Attorney, Agent, or Firm*—Russell B. Miller; Sean English

[57] ABSTRACT

A Viterbi decoder for recovering the original bit data stream that was convolutionally encoded as a code symbol stream in a Code Division Multiple Access (CDMA) mobile communication system. The decoder simultaneously decodes at the several data rates associated with certain multirate vocoders. The decoder can decode at an unknown data rate in either continuous or framed packet modes. It accomplishes this by simultaneously decoding at multiple rates and by creating one or more data quality metrics for each decoded data packet. Special input and output buffering is provided to isolate the decoder from system timing constraints. The input buffer includes selection and accumulation logic to organize code symbol data into the packet order for repeat mode or random burst mode at lower frame data rates. Decoded data packets for each of several predetermined data transfer rates are held in an output buffer for about half of the decoding cycle, thereby permitting the system microprocessor to examine and select the appropriate decoded data packet. The decoder also can be reconfigured to operate at any one of several predetermined convolutional encoding algorithms. The Viterbi decoder, implemented as a single monolithic integrated circuit, can be used in any and all of many different multiuser telecommunications channels.

56 Claims, 12 Drawing Sheets

CDMA MOBILE BLOCK DIAGRAM

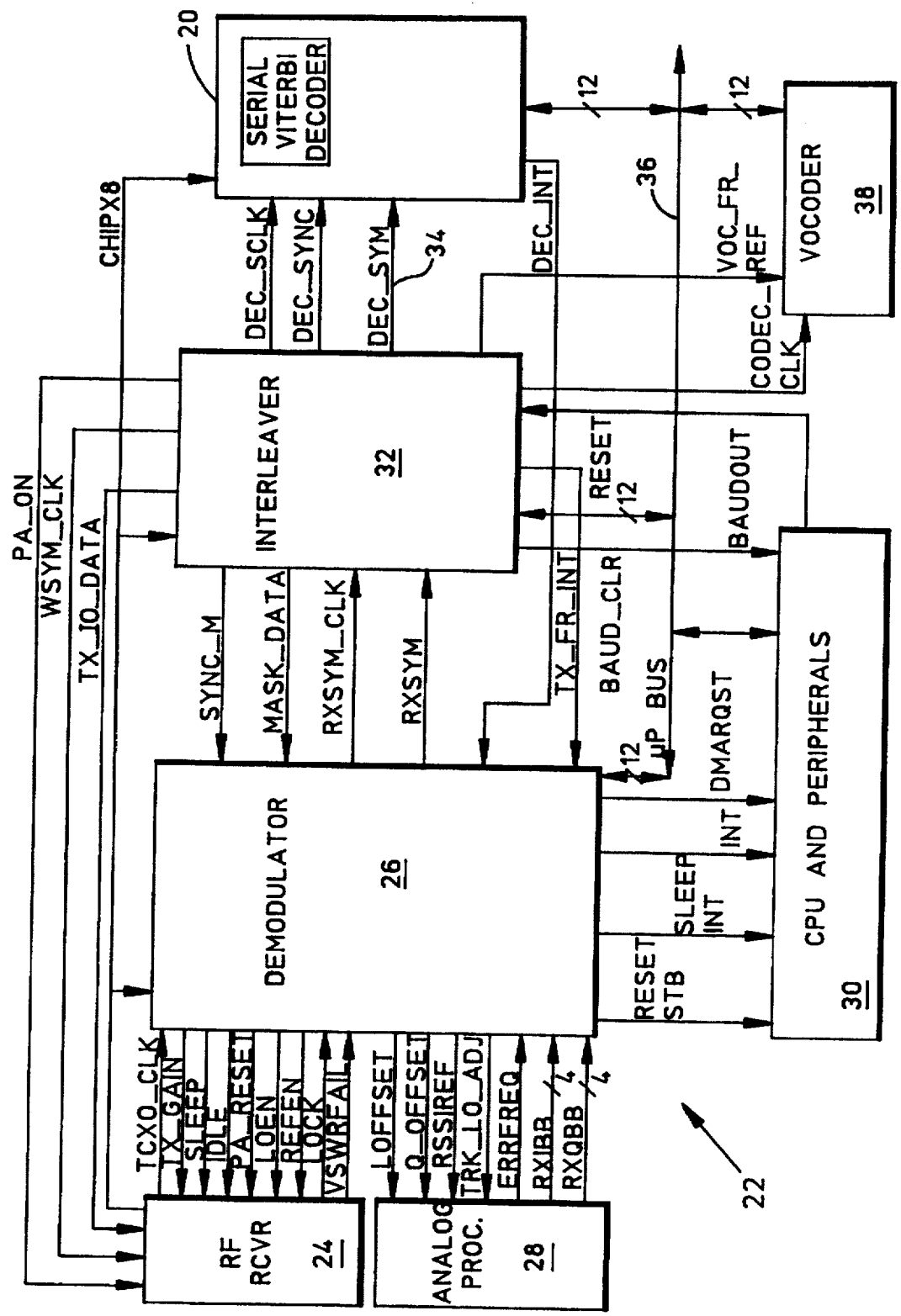
FIG. 1: CDMA MOBILE BLOCK DIAGRAM

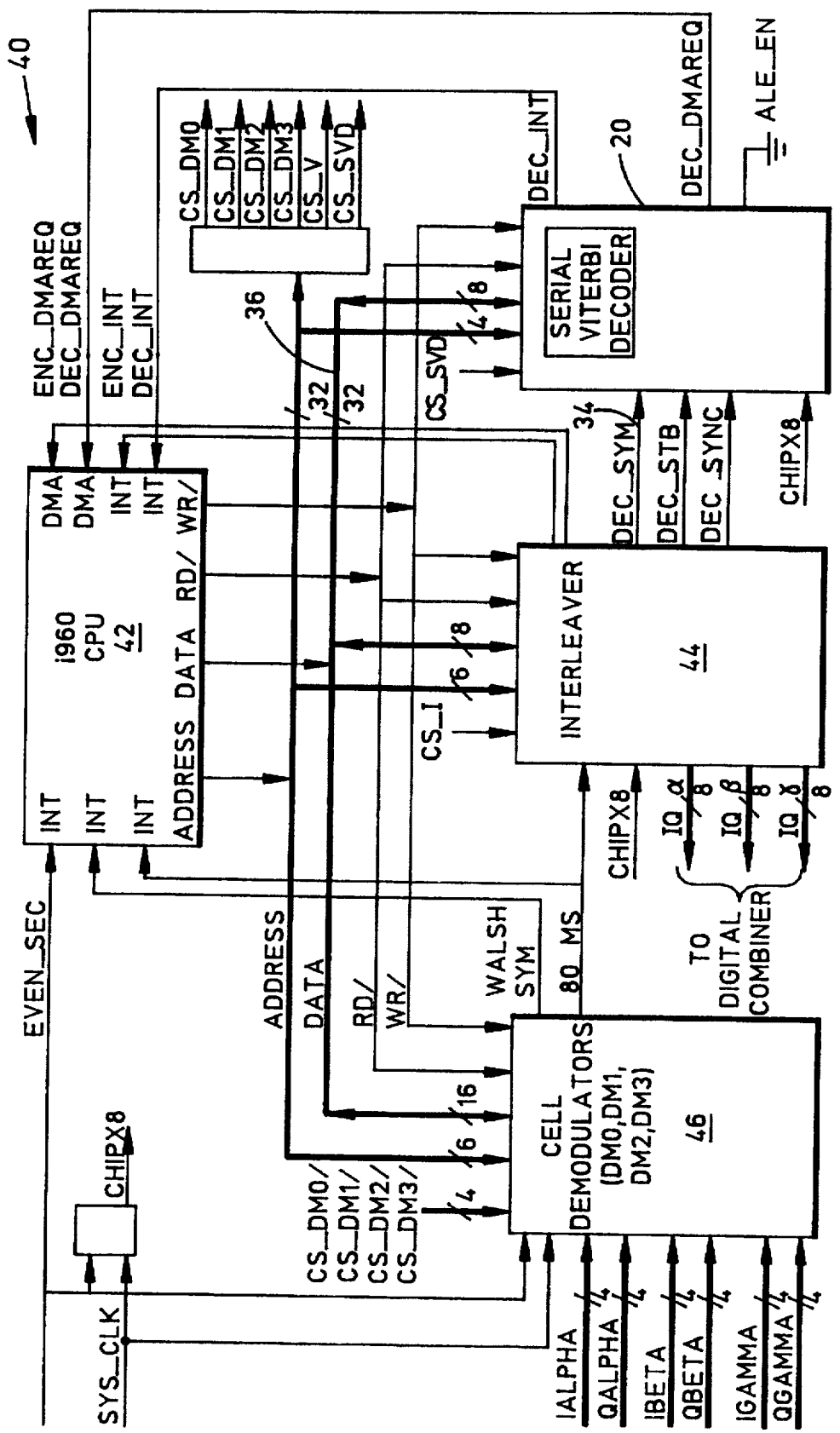
FIG. 2: CDMA CHANNEL CARD BLOCK DIAGRAM

FIG. 3A SYNC CHANNEL MODULATION PARAMETERS

| Parameter | Data Rate (bps) | Units |
|---|---|---|
| | 1200 | |
| PN Chip Rate | 1.2288 | Mcps |
| Code Rate | 1/2 | bits/code symbol |
| Code Repetition | 2 | mod sym/code sym * |
| Modulation Symbol Rate | 4,800 | sps |
| PN Chips/Modulation Symbol | 256 | PN chips/mod sym |
| PN Chips/Bit | 1024 | PN chips/bit |

* Each repetition of a code symbol is a modulation symbol.

FIG. 3B PAGING CHANNEL MODULATION PARAMETERS

| Parameter | Data Rate (bps) | | | | Units |
|---|---|---|---|---|---|
| | 9600 | 4800 | 2400 | 1200 | |
| PN Chip Rate | 1.2288 | 1.2288 | 1.2288 | 1.2288 | Mcps |
| Code Rate | 1/2 | 1/2 | 1/2 | 1/2 | bits/code symbol |
| Code Repetition | 1 | 2 | 4 | 8 | mod sym/code sym * |
| Modulation Symbol Rate | 19,200 | 19,200 | 19,200 | 19,200 | sps |
| PN Chips/Modulation Symbol | 64 | 64 | 64 | 64 | PN chips/mod sym |
| PN Chips/Bit | 128 | 256 | 512 | 1024 | PN chips/bit |

* Each repetition of a code symbol is a modulation symbol.

FIG. 3C FORWARD TRAFFIC CHANNEL MODULATION PARAMETERS

| Parameter | Data Rate (bps) | | | | Units |
|---|---|---|---|---|---|
| | 9600 | 4800 | 2400 | 1200 | |
| PN Chip Rate | 1.2288 | 1.2288 | 1.2288 | 1.2288 | Mcps |
| Code Rate | 1/2 | 1/2 | 1/2 | 1/2 | bits/code symbol |
| Code Repetition | 1 | 2 | 4 | 8 | mod sym/code sym * |
| Modulation Symbol Rate | 19,200 | 19,200 | 19,200 | 19,200 | sps |
| PN Chips/Modulation Symbol | 64 | 64 | 64 | 64 | PN chips/mod sym |
| PN Chips/Bit | 128 | 256 | 512 | 1024 | PN chips/bit |

* Each repetition of a code symbol is a modulation symbol.

FIG. 3D REVERSE TRAFFIC CHANNEL MODULATION PARAMETERS

| Parameter | Data Rate (bps) | | | | Units |
|---|---|---|---|---|---|
| | 9600 | 4800 | 2400 | 1200 | |
| PN Chip Rate | 1.2288 | 1.2288 | 1.2288 | 1.2288 | Mcps |
| Code Rate | 1/3 | 1/3 | 1/3 | 1/3 | bits/code sym |
| TX Duty Cycle | 100.0 | 50.0 | 25.0 | 12.5 | % |
| Code Symbol Rate | 28,800 | 28,800 | 28,800 | 28,800 | sps |
| Modulation | 6 | 6 | 6 | 6 | code sym/Walsh sym |
| Walsh Symbol Rate | 4800 | 4800 | 4800 | 4800 | sps |
| Walsh Chip Rate | 307.20 | 307.20 | 307.20 | 307.20 | kcps |
| Walsh Symbol | 208.33 | 208.33 | 208.33 | 208.33 | μs |
| PN Chips/Code Symbol | 42.67 | 42.67 | 42.67 | 42.67 | PN chip/code sym |
| PN Chips/Walsh Symbol | 256 | 256 | 256 | 256 | PN chip/Walsh sym |
| PN Chips/Walsh Chip | 4 | 4 | 4 | 4 | PN chips/Walsh chip |

FIG. 3E REVERSE ACCESS CHANNEL MODULATION PARAMETERS

| Parameter | Data Rate (bps) | Units |
|---|---|---|
| | 4800 | |
| PN Chip Rate | 1.2288 | Mcps |
| Code Rate | 1/3 | bits/code sym |
| Code Symbol Repetition | 2 | symbols/code sym |
| TX Duty Cycle | 100.0 | % |
| Code Symbol Rate | 28,800 | sps |
| Modulation | 6 | code sym/Walsh sym |
| Walsh Symbol Rate | 4800 | sps |
| Walsh Chip Rate | 307.20 | kcps |
| Walsh Symbol | 208.33 | μs |
| PN Chips/Code Symbol | 42.67 | PN chip/code sym |
| PN Chips/Walsh Symbol | 256 | PN chip/Walsh sym |
| PN Chips/Walsh Chip | 4 | PN chips/Walsh chip |

FIG. 4 NORMAL MODE SETUP

| CONTROL SIGNAL | FORWARD | | | | REVERSE | |
|---|---|---|---|---|---|---|
| | SYNC | PAGING | TRAFFIC | TRAFFIC | TRAFFIC | ACCESS |
| MODULATION CODE SYMBOL RATE | 4,800 | 19,200 | 19,200 | 28,800 | 28,800 |
| ORIGINAL BIT DATA RATE | 1200 | FIXED | 1200-9600 | 1200-9600 | 4,800 |
| CONVOLUTIONAL CODE RATE | 1/2 | 1/2 | 1/2 | 1/3 | 1/3 |
| SYMBOL REPETITION | 2 | 1, 2, or 4 | N/A | N/A | 2 |
| CODING MODE | CONTINUOUS | CONTINUOUS | PACKET | PACKET | PACKET |
| TRANSMISSION MODE | REPEAT | REPEAT | REPEAT | SINGLE BURST | REPEAT |
| START DECODE AT SYMBOL # | 2 | 2 | 2 | 8 | 8 |
| FIG. | 3A | 3B | 3C | 3D | 3E |

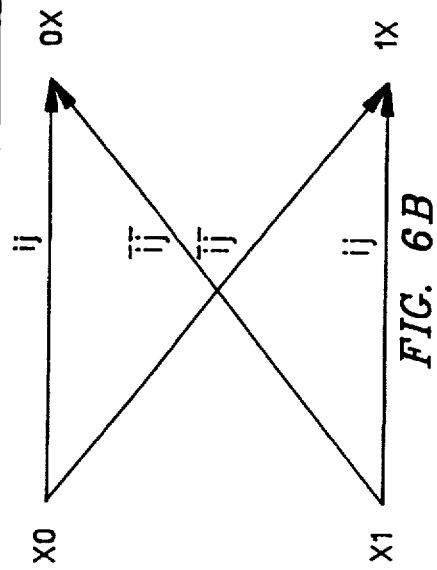

FIG. 6B

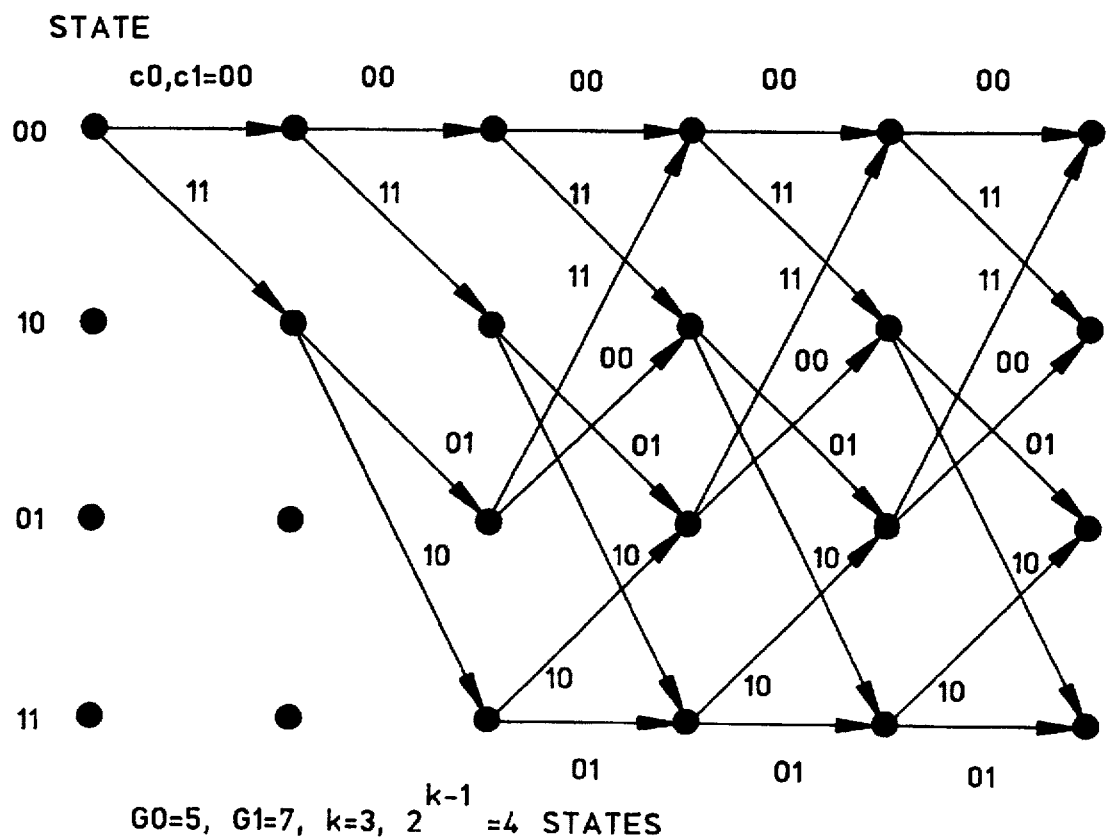
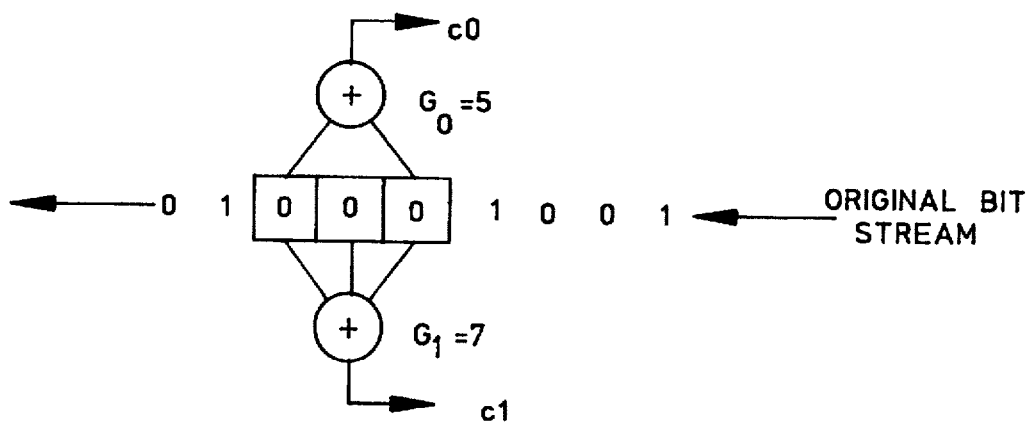
*FIG. 6A k=3 TRELLIS DIAGRAM*

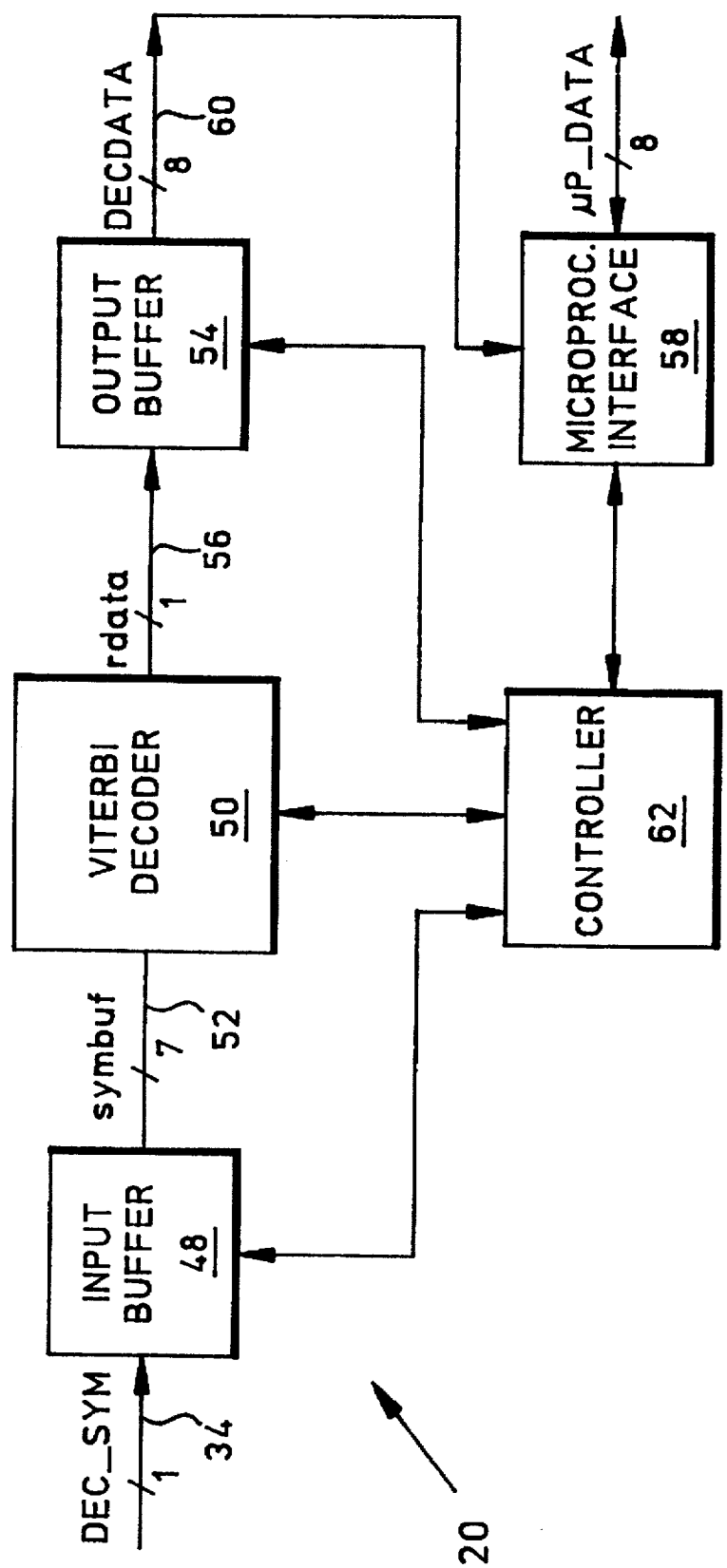
FIG. 5 DECODER BLOCK DIAGRAM

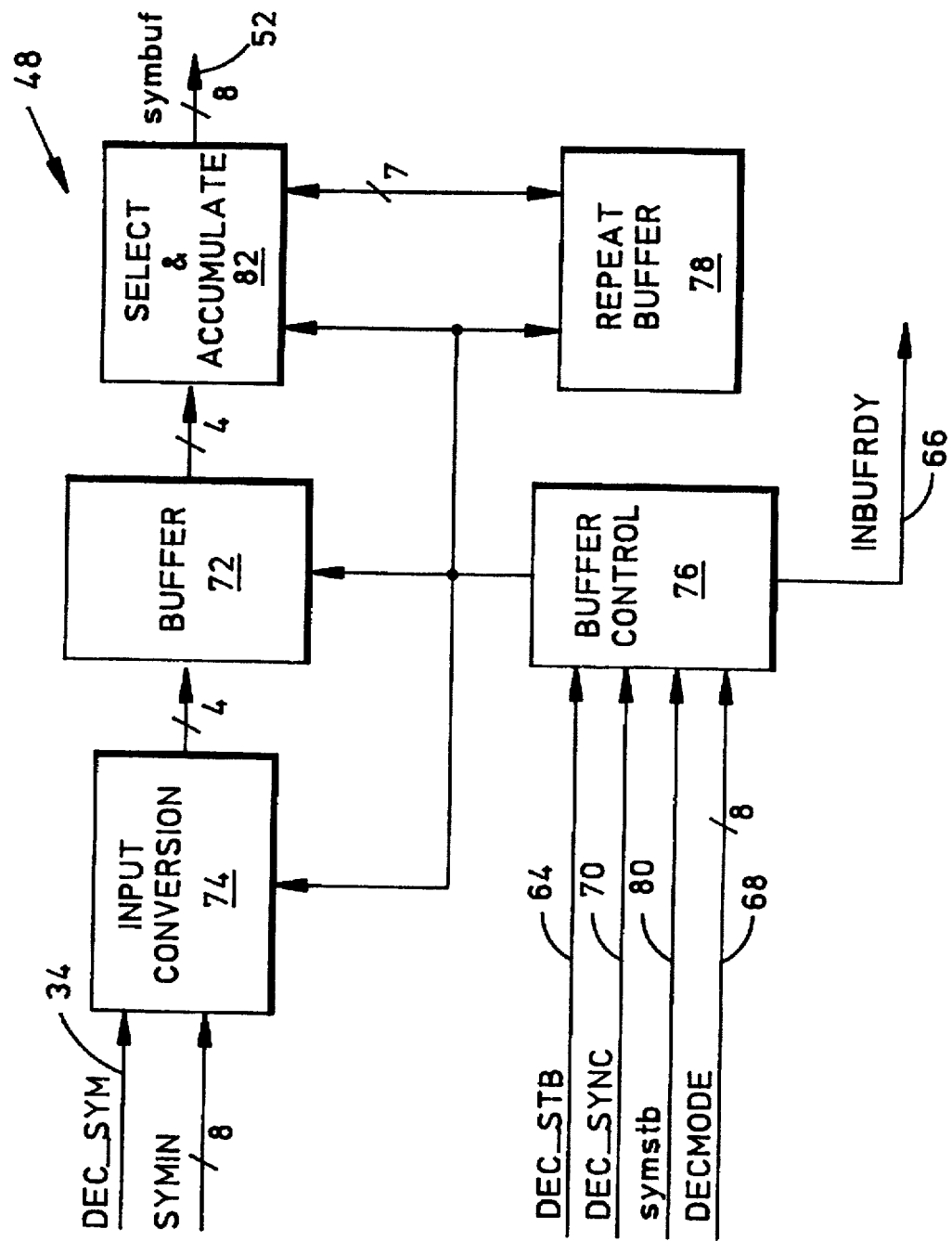
FIG. 7 INPUT BUFFER (IB) FUNCTIONAL BLOCK DIAGRAM

| DBR RATE | DBR bit | selected rows | |
|---|---|---|---|
| DBR bit value -> | | 0 | 1 |
| 1/2 | DBR0 | 0,1 | 2,3 |
| 1/2 | DBR1 | 4,5 | 6,7 |
| 1/2 | DBR2 | 8,9 | 10,11 |
| 1/2 | DBR3 | 12,13 | 14,15 |
| 1/2 | DBR4 | 16,17 | 18,19 |
| 1/2 | DBR5 | 20,21 | 22,23 |
| 1/2 | DBR6 | 24,25 | 26,27 |
| 1/2 | DBR7 | 28,29 | 30,31 |
| 1/4 | DBR8 | DBR0 | DBR1 |
| 1/4 | DBR9 | DBR2 | DBR3 |
| 1/4 | DBR10 | DBR4 | DBR5 |
| 1/4 | DBR11 | DBR6 | DBR7 |
| 1/8 | DBR12 | DBR8 | DBR9 |
| 1/8 | DBR13 | DBR10 | DBR11 |

*FIG. 8 DBRCODE SYMBOL SELECTION*

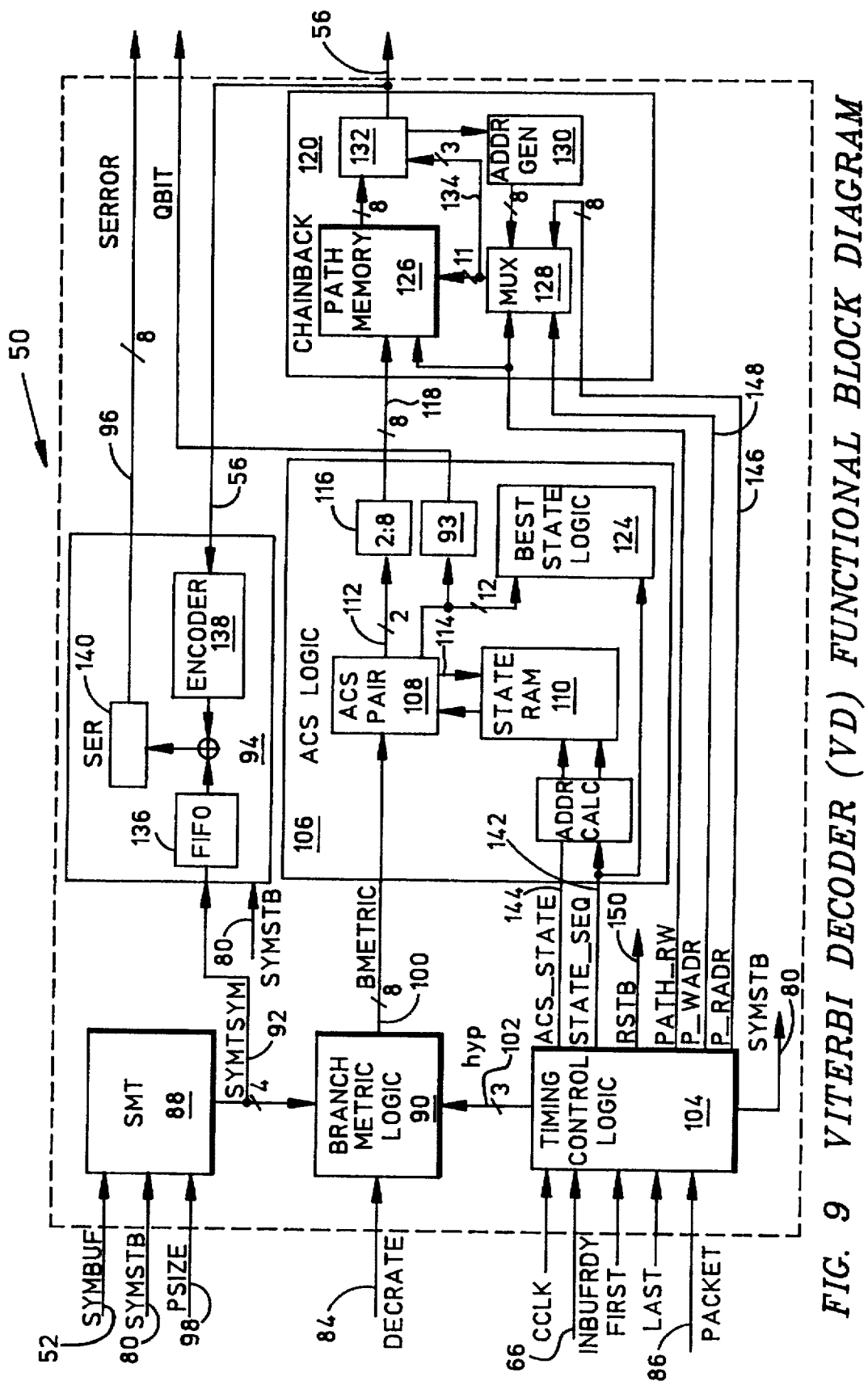
FIG. 9 VITERBI DECODER (VD) FUNCTIONAL BLOCK DIAGRAM

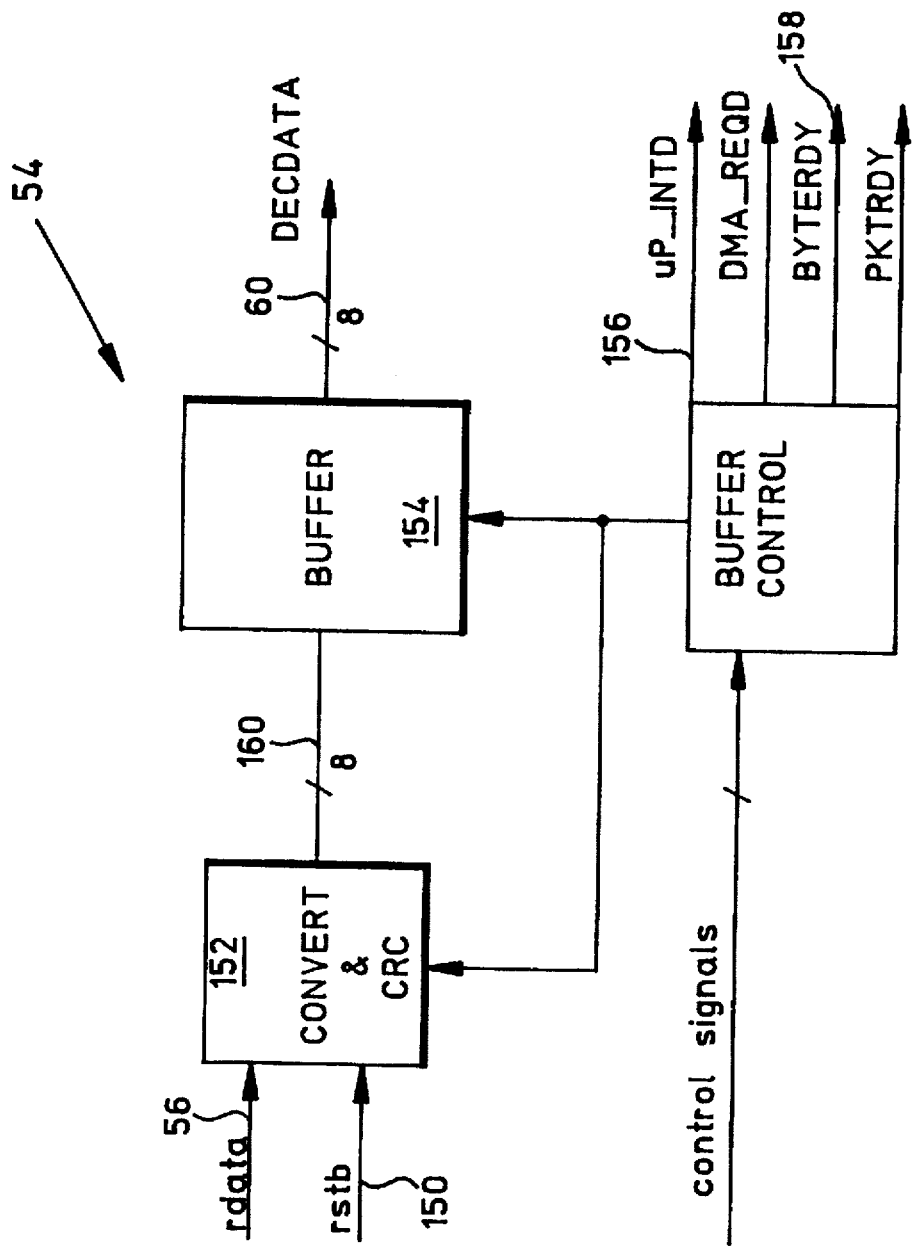
FIG. 10 OUTPUT BUFFER (OB) FUNCTIONAL BLOCK DIAGRAM

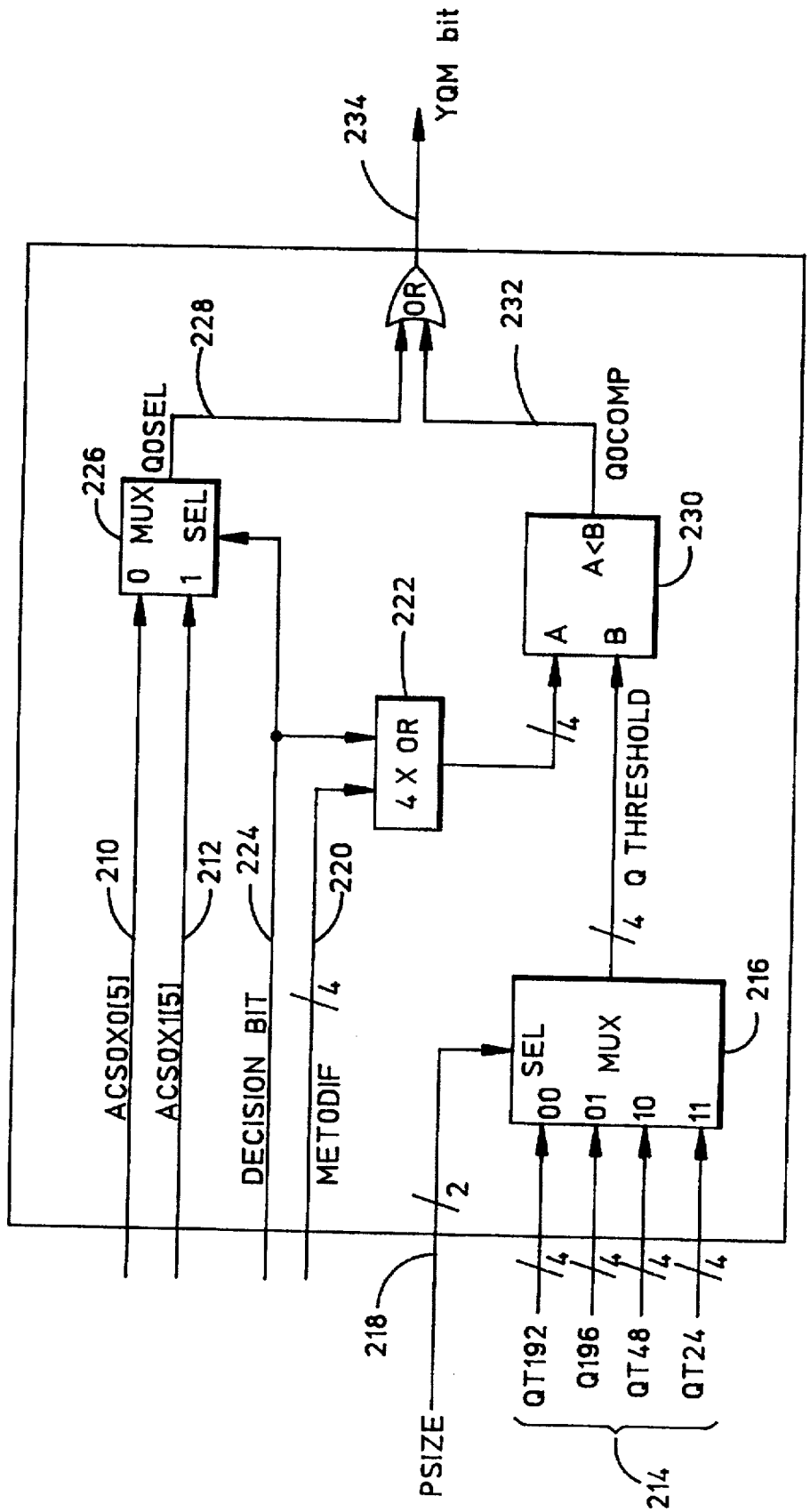
FIG. 11 YAMAMOTO QUALITY METRIC LOGIC

MULTIRATE SERIAL VITERBI DECODER FOR CODE DIVISION MULTIPLE ACCESS SYSTEM APPLICATIONS

This is a Continuation of application Ser. No. 08/126,477, filed Sep. 24, 1993, now abandoned.

CROSS-REFERENCES TO RELATED APPLICATIONS

This application is related by subject matter to a copending patent application entitled "Method And Apparatus For Determining Data Rate Of Transmitted Variable Rate Date In A Communications Receiver" filed as patent application Ser. No. 08/079,196 on Jun. 18, 1993, by Butler, et al and assigned to the assignee hereof. This related application is incorporated herein entirely by this reference.

BACKGROUND OF THE INVENTION

1. Field of the Invention

This invention relates generally to systems for decoding serial digital data streams in a noisy channel and, more specifically, to a convolutional Viterbi decoder for sequential decoding at multiple predetermined data rates.

2. Description of the Related Art

In the digital communications art, it is well-known that data may be transmitted sequentially either continuously or in frames of a constant time duration T, each frame embracing a fixed number of bits N limited to the product of the sequential transmission rate and frame duration T. However, in certain communication systems, it is desirable to transmit fewer than N data during selected frames. One such system is a Code Division Multiple Access (CDMA) communications system, which employs direct sequence spectrum spreading techniques.

In U.S. Pat. No. 5,103,459, assigned to the assignee hereof, Klein S. Gilhousen, et al disclose such a CDMA system for cellular telephone applications. U.S. Pat. No. 5,103,459 is entirely incorporated herein by this reference. In a CDMA system, system capacity is limited by the total interference within the transmission frequency band. The total interference includes the signals of other users, which consist primarily of vocoder data (digitized voice). To reduce the user interference levels as much as possible, the CDMA system disclosed by Gilhousen, et al employs variable-rate vocoder data adapted for transmission in data frames of fixed time duration.

For several reduced vocoder data rates, redundancy is provided in the frame data to support transmission of data throughout the entire frame. Thus, for a frame in which the full data rate is reduced, the fewer than N original data symbols are repeated as necessary to fill the frame with N symbols. Although repetition of the lower-rate data provides the same interference levels as the full data rate at the same transmission power, the redundant information within a frame permits the transmission power to be reduced accordingly for equivalent "information power" or energy per symbol. This technique reduces interference levels to increase system capacity as much as permitted by vocoder redundancies.

Alternatively to repetition of data at reduced power, lower-rate data may be transmitted once only within a single frame without reducing transmission power. This technique produces a full-power transmission during a fraction of the frame and no transmission during the unused frame portion. The data block to be transmitted in a frame may be merely placed at the beginning of the frame or at another predetermined fixed position within the frame. However, in a CDMA system with many users, a more sophisticated block placement procedure is required to evenly distribute the interference from many other users throughout the entire frame. Unnecessary overlap in data transmission by many users would unnecessarily increase system interference levels over the optimal average level.

In U.S. patent application Ser. No. 07/846,312, filed on Mar. 5, 1992, entitled "Data Burst Randomizer", and assigned to the assignee hereof, Gilhousen, et al disclose a sophisticated block placement procedure for ensuring minimal interference levels over the full frame and this patent application is entirely incorporated herein by this reference.

The exemplary CDMA system may also be understood with reference to "PROPOSED EIA/TIA INTERIM STANDARD: WIDEBAND SPREAD SPECTRUM DIGITAL CELLULAR SYSTEM DUAL-MODE MOBILE STATION-BASE STATION COMPATIBILITY STANDARD", Qualcomm, Inc., San Diego, Calif., Apr. 21, 1992. This CDMA system standard specifies five basic channel data modes for both forward and reverse link traffic. There are three forward link modes and two reverse link modes. Depending on the particular data channel mode, one of two different convolutional coding algorithms is specified. Two are continuous modes and three are packet modes wherein sequential data is organized into fixed frame intervals. Three modes operate at only one of several predetermined data rates and two modes operate from frame to frame at any one of four different predetermined data rates.

This variety of data rates and channel modes presents a challenging requirement for any single decoding apparatus. The problem is made more difficult by the real-time nature of serial decoding in a spread spectrum channel. That is, a received signal must be detected, reassembled and decoded in real-time. There is no frame space available for conveying information of the original vocoder data rate. There is little opportunity to examine the received signal for several possible data rates and to decide which particular rate should be decoded for each new frame. Also, it is desirable to use the same decoding apparatus in all system channel modes to avoid component proliferation. The CDMA system described in the above-cited Gilhousen, et al patent employs orthogonal Pseudorandom Noise (PN) coding, interleaving, Bi-Phase Shift Key (BPSK) modulation with orthogonal covering of each BPSK symbol together with Quadrature Phase Shift Key (QPSK) spreading of the covered symbols, and convolutional encoding for error correction. Each of these many coding techniques requires a certain amount of decoding activity at the receive side of each channel mode. Accordingly, there is strong competition for the real-time resources available to serially decode the convolutionally-encoded symbols transmitted for error correction purposes.

Decoding techniques for convolutional codes are well-known in the art and include the Viterbi algorithm for error correction introduced by A. J. Viterbi ("Error Bounds For Convolutional Codes and an Asymptotically Optimum Decoding Algorithm", IEEE Trans. Inform. Theory, Vol. IT-13, No. 2, pp. 260–269, April 1967) and discussed by practitioners such as G. D. Forney, Jr., ("The Viterbi Algorithm", Proc. of the IEEE, Vol. 16, pp. 268–278, 973) and J. A. Heller, et al ("Viterbi Decoding for Satellite and Space Communication", IEEE Trans. Commun. Technol., Vol. IT-19, No. 5, pp. 835–848, October 1971).

Practitioners have improved the Viterbi algorithm in response to various special requirements. For instance, Hirosuke Yamamoto, et al ("Viterbi Decoding Algorithm for Convolutional Codes With Repeat Request", IEEE Trans. Inform. Theory, Vol. IT-26, No. 5, pp. 540–547, September 1980) disclose a Viterbi decoding algorithm with a quality metric for repeat request. Their system offers the same performance when a receiver can use a feedback channel to request retransmission as does a convolutional code having a longer constraint length without feedback. Yamamoto, et al add a single quality bit to the decoder output that signifies "frame quality". If bad, a repeat transmission is requested. They demonstrate that the reliability function of their algorithm is asymptotically twice that of the ordinary Viterbi algorithm without repeat request.

Similarly, N. Seshadri, et al ("Generalized Viterbi Algorithms for Error Detection With Convolutional Codes", GLOBECOM 89 Dallas, Tex., pp. 1534–1538, November 1989) present two generalized Viterbi algorithms with useful application to speech encoded in frames of fixed duration. The high correlation between adjacent speech frames permits the useful estimation of frame contents from adjacent frames in situations where the frame contents exhibit unacceptable error levels. Seshadri, et al show that very reliable intraframe redundancy can be obtained by adding parity bits to the speech data for error detection by a high rate outer cyclic block code. The augmented frame is then encoded by an inner convolutional code and the entire block is then modulated and transmitted over the noisy channel. The inner generalized Viterbi decoder releases a predetermined number of candidates for the decoded frame, only one of which should have the correct parity information. If none have the correct parity and if the information bits represent a frame of quantized speech, then inter-frame reestimation can be performed or, if a return link is available, an automatic repeat request made. Whenever the correct alternative is among the predetermined number of candidates, a retransmission is avoided.

Unfortunately, the above disclosures neither teach nor suggest a real-time decoding method for handling a series of frames having one of several predetermined data transmission rates that may vary from frame to frame without transmission of rate information. The related unresolved problems and deficiencies are clearly felt in the art and are solved by this invention in the manner described below.

SUMMARY OF THE INVENTION

This invention solves the above problem by providing a Serial Viterbi Decoder (SVD) having specialized input and output buffers implemented as a single Very Large Scale Integrated (VLSI) device. The Viterbi procedure is employed to decode a synchronized and quantized code symbol stream at all predetermined data rates for each frame in frame mode and in continuous mode. Several quality metric outputs ("error metrics") are provided to permit data rate determination. The preferred embodiment of the SVD of this invention can decode different data rates without apriori data rate information.

It is an objective of this invention to provide automatic decoding of each frame at any one of a plurality of predetermined data rates without tranmitted rate information. The SVD of this invention accomplishes this objective for each of a plurality of channel modes by making multiple passes to decode each frame at each of all possible predetermined data rates and by providing "error metrics" to permit detection of the original data rate. It is an advantage of the SVD of this invention that it can decode at an unknown one of a plurality of predetermined frame data rates provided that the convolution code is known and the data packet mode (either frame or continuous) is also known. It is yet another advantage of the SVD of this invention that several "error metrics" are obtained for every decoded frame at each hypothetical predetermined data rate for use in establishing the original data transmission rate.

The SVD of this invention provides one such error metric by recoding the decoded output data stream comparing it with the incoming code symbol stream to estimate the Serial Error Rate (SER) of the incoming stream. The SVD of this invention may include other error metrics such as Cyclic Redundancy Check (CRC) results and, Yamamoto Quality Metric (YQM). The SER metric estimates errors in the received code symbols. The CRC results detect bit errors in the original bit data. The YQM indicates that estimated error conditions in the decoded frame exceed a predetermined threshold. It is an advantage of the SVD of this invention that the receiver provides one or more of these "error metrics" as means for detecting original data rate without receiving rate information from the transmitter.

It is another object of this invention to provide decoding in a single SVD device for every necessary channel mode. The SVD of this invention permits a single VLSI device to be used in both the forward and reverse link channel modes of an exemplary CDMA system. For instance, a preferred embodiment of this SVD produces a high decoding gain that approaches the theoretical limit for rate ½ and ⅓ convolutional codes having constraint length 9, wherein code symbol data are processed in frame packets of N=384 symbols (rate ×½) or N=576 symbols (⅓). Frame packets beginning and ending in any fixed state or a continuous code symbol data stream may be decoded with the SVD of this invention. For instance, in repeat mode, the CDMA channels operate so that each symbol is repeated as necessary to fill the frame and the repeated symbols are accumulated into a single symbol in the SVD of this invention to reduce bit rate and power. In the reverse CDMA link data burst randomizer (DBR) mode, only one symbol from each set of repeated symbols is transmitted using a pseudorandom frame positioning technique described in the above-cited Gilhousen, et al patent application. Using code rate options and repeat modes, the SVD of this invention processes code symbol streams with any predetermined effective data rate in either the forwarded repeat mode or reverse DBR mode.

It is yet another object of this invention to isolate the internal decoding procedure from the external channel timing requirements. The SVD of this invention accomplishes this by providing means for sending an interrupt to the channel microprocessor and by providing an output buffer to isolate the microprocessor from the system frame timing and to hold the decoded data and quality metric data. The SVD of this invention also includes an input buffer that allows code symbols either to be accepted into the SVD continuously at the channel symbol rate or to be burst into the SVD as frame packets. Specialized input and output buffers allow the SVD of this invention to operate independently of external channel and microprocessor timing. A flexible microprocessor interface allows the SVD to be used with a variety of microprocessor systems.

The SVD of this invention includes five major elements as shown in FIG. 5. The Input Buffer (IB) stores more than one frame of code symbol data. In block mode, this permits the SVD to reprocess the data as many times as necessary to identify the actual repeat or DBR mode data rate used in the channel frame. The Viterbi Decoder (VD) accepts soft decision code symbols from the IB and processes them in an Add-Compare-Select logic known in the art. Decisions from the ACS process are stored in an internal path memory within the VD. A chain-back process through this path memory provides a single data bit for each code symbol set after tracing backward in time through many decision words. Each of these single data bits together with quality metrics such as the Yamamoto Quality Metric (YQM) are stored in the Output Buffer (OB), which is the third element of the SVD of this invention. In frame packet mode, the code symbols are decoded for four different rates and the four resulting decoded data packets (including quality information) are stored in the OB and held for about half of the fixed frame time duration to allow the microprocessor to read them. The fourth element is a Control Block (CB) that generates all internal timing signals necessary for operation of the SVD of this invention. This internal timing is derived from the CDMA system clock and an external decoder synchronization strobe signal. The SVD of this invention is initialized and controlled through a fifth Microprocessor Interface (MI) element, which is coupled to the fourth CB element of this invention. Data may be received through the MI as well.

The foregoing, together with other objects, features and advantages of this invention, will become more apparent when referring to the following specification, claims and the accompanying drawing.

BRIEF DESCRIPTION OF THE DRAWING

For a more complete understanding of this invention, reference is now made to the following detailed description of the embodiments as illustrated in the accompanying drawing, wherein:

FIG. 1 is a functional block diagram of the CDMA mobile receiver;

FIG. 2 is a functional block diagram of the CDMA cell-site channel card receiver;

FIG. 3, comprising FIGS. 3A–3E, is a specification of five CDMA channel types;

FIG. 4 is a specification of the normal CDMA mode set-up parameters;

FIG. 5 is a functional block diagram of the Serial Viterbi Decoder (SVD) of this invention;

FIG. 6, comprising FIGS. 6A–6B, illustrates the theoretical operation of a Viterbi decoder;

FIG. 7 is a functional block diagram of the Input Buffer (IB) of this invention;

FIG. 8 is a Data Burst Randomizer (DBR) symbol selection specification for the CDMA system;

FIG. 9 is a functional block diagram of the Viterbi Decoder (VD) element of this invention;

FIG. 10 is a functional block diagram of the Output Buffer (OB) of this invention; and FIG. 11 is a functional block diagram of the Yamamoto Quality Metric (YQM) logic of this invention.

DESCRIPTION OF THE PREFERRED EMBODIMENTS

The CDMA System Decoding Problem

For the purposes of discussion and description herein, this invention is described within the context of the exemplary CDMA mobile communications system embodiment described in the above-cited Gilhousen, et al patent. However, it should be understood that this invention is applicable to other types of communication systems, such as personal communication systems (PCS), wireless local loop, private branch exchange (PBX) or other useful telecommunications systems. Furthermore, other systems employing other well-known transmission modulation techniques such as Time-Division Multiple Access (TDMA) may also employ this invention. As described in the above-cited Gilhousen, et al patent, the exemplary CDMA mobile communications system embodiment presents a number of demanding requirements for decoding apparatus and procedures that, until now, could not be effectively met with a single decoder design known in the art. These requirements are now briefly set forth for exemplary purposes as follows.

FIG. 1 shows a block diagram of a mobile receiver modem design for the CDMA system. The Serial Viterbi Decoder (SVD) 20 of this invention is shown in relationship with the other elements of mobile modem 22. In operation, radio frequency signals are received at the RF receiver 24 and demodulated in the demodulator 26 with the participation of the analog processor 28 and under the control of a central processing unit (CPU) 30. The demodulated data stream is deinterleaved by an interleaver 32, which provides a serial symbol stream at the SVD input 34. Synchronization, timing and clock signals are forwarded to SVD 20 on the appropriate signal lines. SVD 20 is coupled to a microprocessor bus 36 for communication with the vocoder 38, which reconstructs the speech signals that have been decoded by SVD 20.

FIG. 2 shows the same SVD 20 as it relates to the cell-site receiver modem channel card logic 40. The CPU 42, the interleaver 44 and the demodulators 46 are functionally similar the their counterparts in FIG. 1. As in FIG. 1, SVD 20 accepts a serial code symbol stream on decoder input 34 and produces a parallel data stream at microprocessor bus 36 for transfer to other elements (not shown) of logic 40.

For the CDMA system disclosed in the above-cited Gilhousen, et al patent, SVD 20 must operate in any of five basic channel modes to provide all required decoding for both forward and reverse link data. These modes are described in FIG. 3A–3E. The forward link from cell-site to mobile user employs the three modes shown in FIGS. 3A–3C (sync, paging and traffic). The reverse link from mobile user to cell-site employs the two modes shown in FIGS. 3D–3E (access and traffic).

FIG. 3A describes the forward link sync channel modulation parameters by way of example. Sync channel data are decoded from a channel that is convolutionally encoded at rate ½ (constraint length K=9) and each code symbol is repeated once. The data are transmitted at 4800 modulation symbols per second and SVD 20 receives a superframe containing 384 modulation symbols every 80 milliseconds. Thus, SVD 20 can be preset to a fixed 1200 bps rate for this channel. The original bit data are encoded as a continuous stream without Cyclical Redundancy Check (CRC) codes at frame boundaries. The equivalent original bit data rate is 1200 bps.

FIG. 3B describes the forward paging channel modulation parameters by way of example. Paging channel data are decoded from a channel that is convolutionally encoded at rate ½ (K=9) and each code symbol is transmitted either one, two or four times, depending on the original bit data rate. The original bit data rate for this channel is preset and does not vary from frame to frame. Thus, SVD 20 can be preset to a fixed original bit data rate for this channel. The data are transmitted at 19,200 symbols per second and SVD 20 receives a frame containing 384 modulation symbols every 20 milliseconds. The data are encoded as a continuous stream without CRC codes at frame boundaries.

FIG. 3C provides the forward traffic channel modulation parameters by way of example. Forward link traffic channel data are decoded from a channel that is convolutionally encoded at rate ½ (K=9) and each code symbol is transmitted up to eight times, depending on the original bit data rate selected for each frame by the originating vocoder. The original bit data rate can change from frame to frame under originating vocoder control and SVD 20 must decode at all possible rates for every frame because this data rate cannot be preset. The data are transmitted at 19,200 modulation symbols per second (sps) and SVD 20 receives a new frame of 384 modulation symbols every 20 milliseconds. The data are encoded as packets that begin and end in the zero state ("0" bits added at the end of each frame before encoding) and a CRC code is expected at the end of each packet of 96 original bits and 192 original bits. No CRC code is expected with shorter (48 and 24 bit) packets because space limitations make a CRC too expensive.

FIG. 3D describes the reverse traffic channel modulation parameters by way of example. Reverse link traffic channel data are decoded from a channel that is convolutionally encoded at rate ⅓ (K=9). Each code symbol is repeated up to seven times (making eight occurrences) but only one of each repeated code symbol is transmitted in a burst. The burst timing is determined by a random number taken from the last few bits of the PN code for the preceding frame. The code symbol repetition rate depends on the originating vocoder data rate for each frame. SVD 20 must simultaneously decode at all rates for each frame because the original bit data rate can be changed from frame to frame by the originating vocoder. Although SVD 20 does not know the original bit data rate for a particular frame, the burst timing for each frame of repeated symbols is available from the last few bits of the PN code for the preceding frame. The data are transmitted at 28,800 code symbols per second and SVD 20 receives a frame containing 576 potential code symbols every 20 milliseconds. The data are encoded as packets that begin and end in the zero state because of the "0" bits added at the end of each packet. A CRC code is expected at the end of each packet of 96 original bits and 192 original bits (just before the "0" bit sequence). Frames containing fewer than 96 original bits omit the CRC code to save space.

FIG. 3E provides the reverse link access channel modulation parameters by way of example. Reverse link access channel data are decoded from a channel that is convolutionally encoded at a rate ⅓ (K=9) and each code symbol is transmitted twice. The original bit data rate is fixed at 4800 bps and the SVD 20 for this channel can be preset to operate at this single fixed rate. The data are transmitted at 28,800 code symbols per second and SVD 20 receives a frame containing 576 code symbols every 20 milliseconds. The data are encoded as packets that begin and end in the zero state "0" bits added to the end of each packet) but no CRC codes are provided.

The SVD of this invention is suitable for each of the five exemplary channel descriptions provided in FIG. 3 because of its capacities for continuous multirate decoding, for switching from continuous to packet mode and for switching between (½ to ⅓) convolutional coding rates. More importantly, the SVD of this invention can decode either forward or reverse traffic channel data. This forward and reverse traffic channel distinction can be better appreciated with reference to the above-cited Gilhousen, et al patent and patent application.

FIG. 4 provides a table summarizing the control signal functions necessary to the SVD of this invention for each of the five exemplary channels discussed above in connection with FIG. 3. Note that the forward paging and sync channels original bit data rates are fixed.

The Monolithic SVD Embodiment

The SVD of this invention is preferably implemented as a single Very Large Scale Integrated (VLSI) circuit. FIG. 5 shows the five major elements of an exemplary embodiment of SVD 20. The Input Buffer (IB) 48 stores 1.5 frames of data, thereby allowing multiple decoding passes through a single frame to allow later determination of the correct repeat or Data Burst Randomizer (DBR) mode data rate for the frame. The Viterbi Decoder (VD) 50 accepts the soft decision symbols from IB 48 on a 7-bit symbuf bus 52. These code symbols are processed by Add-Compare-Select (ACS) logic and the results are stored as state metrics in internal Random Access Memory (RAM). Decisions from the ACS process are stored into an internal path memory. A chain-back process through this path memory identifies a single output data bit for each code symbol group after tracing backward in time through 64 levels of decision words to ensure that the path has merged with the most likely global path. These output data bits together with Quality Metric (QM) information are stored in the Output Buffer (OB) 54 through the data line 56. After completion of the decoding by VD 50, OB 54 retains the decoded data bits for access by the microprocessor interface 58 on the decdata bus 60. In packet mode, the code symbols are decoded at four different original bit data rates and the four resulting output data packets are stored in OB 54 together with the associated QM data. This arrangement allows the microprocessor (not shown) about 10 milliseconds to read the data in OB 54. SVD 20 is initialized and controlled through microprocessor interface 58 and the controller 62, which generates all necessary internal timing for SVD 20. The timing is derived from the system clock and a decoder synchronization strobe (not shown).

The Viterbi Decoding Algorithm

The general theory of operation of a Viterbi decoder is well-known in the art and can be appreciated by referring to one of the above-cited references. This theory is now briefly described to facilitate appreciation of this invention.

A convolutional encoder transforms a sequence of original data bits (the input bit stream) into a sequence of code symbols (the output symbol stream). For each input bit, there are a number of output code symbols that are determined by this input bit and the previous (K−1) input bits, where K is the constraint length of the encoder. The number of code symbols created for each bit symbol is determined by the encoding rate; that is, for example, two for rate ½ and three for rate ⅓. Each code symbol is generated by shifting and XORing the input stream according to a specific polynomial code such as the rate ½ G1 code represented by the sequence $x^8+x^6+x^5+x^4+1$ (octal value $0561_8$). The number of bits in the polynomial code is the same as the constraint length, which is fixed at nine for the preferred embodiment of the SVD of this invention. The actual codes, (G0, G1) or (G0, G1, G2), are chosen from simulations of nonsystematic codes made to determine the codes with the best error properties in the mobile environment. The preferred convolutional codes used in the exemplary CDMA system discussed above are; for the forward link, $G0=0753_8$ and $G1=0561_8$; and, for the reverse link, $G0=0557_8$, $G1=0663_8$ and $G2=0711_8$. These convolutional codes provide a minimum free Hamming distance of 12 for the ½ coding rate and a minimum free Hamming distance of 18 for the ⅓ coding rate.

The Viterbi decoder algorithm operates by finding the most likely decoding sequences for an input code symbol stream. First, the state metrics or weights of the relative probabilities for each of the possible paths are calculated. The most likely transitions into each state are saved in a path memory for all states and then the decoder traces or chains backward in time through the most likely sequence to choose each output bit. The primary steps in this process are branch metric generation, state metric generation and chainback path decision. The performance of a decoder for a particular constraint length and rate is determined by three parameters: the step size and number of quantization levels of the input code symbols, the state metric normalization procedure, and the effective chainback depth of the path memory.

The branch metrics are the cost functions corresponding to the logarithm of the transition probabilities that each possible bit transition has generated the given soft decision input code symbols. The sign and magnitude information in the soft decisions is scaled and combined to produce each branch metric. For rate ½, there are four possible metrics. For rate ⅓, there are eight and, for an arbitrary rate 1/n, there are $2^n$ possible metrics. The equations used to calculate and scale the branch metrics are selected for the best decoder performance on the target channel using experience and simulation. These equations are implemented in the SVD logic of this invention. Metric inputs are scaled by the symbol metric values stored in the Symbol Metric Table (SMT) within VD 50. An "erasure" level causes the code symbol to be ignored in the branch metric calculation. Erasures can be used to "puncture" a code when higher channel data rates are required. Also, an erasure can be used to remove some of the channel code symbols that are part of a "hidden" data or control channel. Since the erased code symbol does not contribute to the metric value, a reasonable erasure rate has no significant effect on decoding performance.

The convolutional codes can generate an infinite sequence of code symbols but certain properties of the codes make it possible to reduce the number of symbol sequences. The first property is that only the best (most because) path into a state is of interest because any global path through a state must follow the best local path. The second property is that the convolutional code structure is repetitive and has a symmetrical code tree. The code sequences therefore must merge into equivalent sequences generated by a finite number of unique bit stream patterns. For a given constraint length, K, there will be $2^{K-1}$ possible data bit patterns (denominated herein as "states") that must be evaluated to locate the most likely global path.

FIG. 6A shows a typical trellis diagram representation of the merging sequences or paths for an exemplary K=3 (½) code based on $G0=5_8$ and $G1=7_8$. The symbols required for transitionlng between states are shown on the diagram. For each state, a state metric (not shown) is calculated representing the relative probability of following a path through that state. The state metric calculation is performed by an Add-Compare-Select (ACS) process. The state metric for each of the possible states preceding a present state is Added to the branch metric for the transition from that previous state to the present state. The sums are Compared and the most likely transition, represented by the smallest sum, is Selected and assigned to the present state as the state metric. The decision bit from each ACS is the value of the least significant bit (the oldest bit) for the previous state from which the selected transition originates. The decisions for all states in a column of the trellis becomes a path memory word.

Since the first and last terms in the generator polynomials (G0 and G1) are unity, the hypothesis (i,j) for the transmitted symbols (c0, c1) on the two paths entering or leaving any state are binary compliments. These ACS state relationships are displayed graphically in the butterfly diagram of FIG. 6B. Of course, in a noiseless channel, the code symbol values (c0, c1) are error-free and the state metrics are either zero or saturated at maximum value, with the zero state metric representing a state on the most likely global path.

Referring to FIG. 6B, the branch metric from state x0 to state 0x is added to the x0 state metric to determine the first of two possible 0x state metrics. The second possible 0x state metric is found by adding the branch metric from state x1 to the x1 state metric value. The least of these two possible values is then assigned as the new 0x state metric value. This process is repeated for the 1x state and for all other states in that trellis column. A new column is created for each new set of code symbols corresponding to a single original bit. The difference between each pair of state metrics is compared to a predetermined Quality Threshold (QT) to yield a Yamamoto Quality Metric (YQM) or "qbit" for the new state in the manner suggested by Yamamoto, et al in the above-cited paper and as described herein below in connection with FIG. 12.

Once the matrix of local ACS decisions is stored in the path memory, the chainback process follows a path back through this matrix. Chainback starts at a "best state" reported by the ACS array and then uses the decision at that state (bit address) in path memory word to determine the previous best (most probable) state. The chainback is run through at least five or six constraint lengths of decisions to ensure that the path being followed has merged with the most likely global path. For a constraint length of 9, a chainback path depth of 63 states is sufficient. The last decision at the end of the chainback is accepted as the best decision for that output bit from the Viterbi decoder. For each subsequent original data bit, a new decision word and new best state are generated by the ACS array and the chainback process is repeated back from the new trellis column through the same path length. Thus, each new bit symbol steps the 64-state chainback window in path memory forward by one trellis column.

In the exemplary frame specification discussed above in connection with FIG. 3, for all modes of operation where the data is packetized the encoding is started and ended at the all "zero" state by inserting a tail of eight "0" bits at the end of the data. In multirate decoding, the SVD forces the decision bits input to path memory during the first eight trellis columns of each frame to be zero. This ensures that the selected path for each frame starts and ends in the all "zero" state for all possible data rates.

Input Buffer (IB) Description

The following functional description of SVD 20 of this invention relies on these exemplary definitions for various processing cycles.

Internal CHIPX8 Clock:

This is the main clock for internal device operation and is preferably 9.8304 MHz.

Calculation Cycle: This is the time to process a branch metric and each pair of previous state metrics through ACS pair 108 (FIG. 9) and is equivalent to two internal CHIPX8 clock cycles.

Process Cycle:

This is the time to process one original data bit through chainback and is equivalent to 128+3 calculation cycles, which are required to completely process 64 branch metrics through ACS logic 106.

Block Cycle:

This is the processing time for one of the four possible frame packet sizes and is equivalent to either 192, 96, 48 or 24 process cycles.

Buffer Cycle:

This is the time to process all four possible packet rates for a frame and to perform final chainback flush and clean-up operations in VD 50. This is equivalent to 432 process cycles (192+96+48+24+72).

Frame:

This is the time window required to send all code symbols in a packet and is normally equal to 20 milliseconds except for the sync channel, where three 26.67 millisecond frames are accumulated to form a single 80 millisecond superframe.

FIG. 7 provides a schematic block diagram illustrating the preferred embodiment of the Input Buffer (IB) 48 of this invention. IB 48 receives code symbols on decoder input line 34 and presents these code symbols selected and accumulated for all possible predetermined vocoder data rates on symbuf bus 52. As shown in FIG. 4, IB 48 operates in repeat mode for the forward link channels and in either repeat mode or Data Burst Random (DBR) mode for the reverse link channels. In repeat mode, IB 48 accumulates code symbols to present them on symbuf bus 52 at an accumulated symbol rate of ½, ¼ and ⅛ the input code symbol rate following initial full-rate presentation. In DBR mode, IB 48 selects code symbols for bursting in the ½, ¼ and ⅛ data block sizes located in the frame according to a randomized code word extracted from the last few bits of the PN sequence in the preceding frame following initial full-frame block bursting. Code symbol inputs on decoder input line 34 are the same for both IB modes. Code symbol bits are strobed in by the DECSTB line 64 and, when IB 48 has received enough code symbols to keep up with the VD 50 decoding process, a ready strobe signal is sent to VD 50 on the INBUFRDY line 66. IB 48 then supplies code symbols in sequence on demand to VD 50 over symbuf bus 52.

The decoder mode is controlled by a mode control word on a DECMODE bus 68, which includes several control bits affecting operation of IB 48. The various IB 48 operating modes can be appreciated by referring to FIG. 4. Several of the signals on DECMODE bus 68 also determine the timing for the strobe signal on inbufrdy line 66 to VD 50. One of these bits determines the code symbol boundaries for each of the four different packet sizes corresponding to the four alternate original bit data rates described above in connection with FIG. 3. Another of the bits on DECMODE bus 68 determines whether the repeated code symbols are accumulated by IB 48 before being presented to symbuf bus 52 or merely selected according to a DBR position code.

Each input cycle for SVD 20 begins with a strobe signal on the DECSYNC line 70. The strobe on DECSYNC line 70 occurs at least 15 internal clock (CHIPX8) cycles before the strobe on DECSTB line 64 for the first coding symbol of the packet to allow time for initialization of IB 48. After each strobe on line 70, IB 48 expects to have either 384 or 576 code symbols strobed into a buffer 72 by DECSTB line 64. The convolutional code rate (FIG. 4) determines whether 384 (=2×192) or 576 (=3×192) code symbols are expected. Code symbol bits on decoder input 34 are continuously clocked in serially, from Most Significant Bit (MSB) to Least Significant Bit (LSB), by the internal CHIPX8 clock (not shown). The LSB of each symbol is marked by a strobe on DECSTB line 64 and the entire code symbol is latched into a parallel symbol register 74 thereby. If the code symbols come from a convolutional deinterleaver, the input symbols are clocked in by DECSTB line 64 at the rate of 384 symbols per frame. If operating in a reverse link channel, the code symbols come from a block deinterleaver and the input code symbols are burst into IB 48 at up to the maximum input rate (one code symbol every seven internal CHIPX8 clock cycles). The maximum burst rate is limited by arbitration logic (not shown) that permits code symbols to be read from buffer 72 as it is being filled. The buffer control logic 76 generates the signal on INBUFRDY line 66 to inform controller 62 when output on symbuf bus 52 may begin.

A two-bit "psize" counter (not shown) in buffer control 76 is reset by the INBUFRDY strobe on line 66. The contents of the psize counter represents the packet size for the code symbol at symbuf bus 52, which may be 24, 48, 96 or 192 original bits. The strobe on line 66 starts the operation of VD 50 and the number of code symbols that must be received by IB 48 before line 66 is activated is dictated by two bits on DECMODE bus 68 (see FIG. 4). This selectable INBUFRDY line 66 strobe delay allows optimization of the processing delay in SVD 20.

Upon strobing of INBUFRDY line 66, the read address of buffer 72 and the write address of the repeat buffer 78 are reset. The first code symbol in buffer 72 is then prefetched and latched onto symbuf bus 52. The read address pointer for buffer 72 is then incremented and the next code symbol is fetched and latched onto bus 52 responsive to a strobe on symstb line 80. The IB read strobe on symstb line 80 is limited to one read cycle for every seven internal CHIPX8 clock cycles to allow time for the interleaving of reading and writing operations for buffer 72. The number of code symbols to be read for the current frame is dictated by the signals on DECMODE bus 68. After code symbols representing 192 original data bits are read from buffer 72 for the first packet, the 96, 48 and 24 bit packets are then read from repeat buffer 78 according to the select and accumulate logic 82. The read and write addresses for repeat buffer 78 are reset and the psize counter (not shown) in buffer control 76 is incremented after reading the last code symbol of each packet. The psize counter content determines the address of the code word fetched from buffer 72 or repeat buffer 78 and also controls select and accumulate logic 82 to present the proper code symbol to symbuf bus 52. The read address pointer for repeat buffer 78 is incremented after each read whenever the psize counter is non-zero. The write pointer for repeat buffer 78 is incremented by one after every other read from either buffer 72 or repeat buffer 78. Code symbols are output from IB 50 in the same sequence without regard to the SVD 20 operating mode but VD 50 ignores the unused packets when operating at a fixed repeat rate in a continuous mode.

As the code symbols are read from buffer 72 in repeat mode, each pair of code symbols is added together by logic 82 and stored into repeat buffer 78. The accumulator is reset to zero when INBUFRDY line 66 is strobed and after the sum for each pair is written into repeat buffer 78. As the code symbols are read from repeat buffer 78, they also are added in pairs and written back into repeat buffer 78. This same operation is repeated on each symbol pair from the 192, 96 and 48 symbol packets. The 7-bit word length in repeat buffer 78 allows storage without truncation of the sum of up to 8 such code symbols. When operating in DBR mode, the accumulated code symbol feedback into the accumulator in logic 82 is forced to zero so that the output from logic 82 is the symbol input from buffer 72. The write to repeat buffer 78 is enabled only for the symbols selected by the DBR code bits (not shown). The content of the psize register and the row address (transmitted slot number) control which DER code bit is used to select symbols. The set of DER code bits is chosen such that the DER code bits for any lower rate are a subset of the DER code bits for a higher rate.

The forward link sync channel uses 26.67 millisecond frames of 128 symbols and these symbols are sent as a continuous stream at a constant 4800 symbols per second. IB 48 accepts three deinterleaver sync frames in 80 milliseconds to make up one decoder packet having 384 symbols, but only one strobe on decsync line 70 is required from the deinterleaver for this "superframe". Each sync channel code symbol is repeated twice and the 80 millisecond frames on this 1200 BPS channel are decoded as 96-bit packets with a symbol repetition factor of two. The sync channel operates in continuous mode but the output data is delayed by 71 bits because of delays through SVD 20. The first bit in each packet is the twenty-sixth bit of the 26.67 millisecond sync packet received 6 packets previous to the current packet. These timing details are handled by controller 62 and microprocessor interface 58 (FIG. 5).

In the reverse link channels, 576 symbol frames may be burst into IB 48 at up to the chip rate, which is one-eighth of the internal CHIPX8 clock rate. The code symbols are written sequentially into buffer 72, which may be considered as a 32 row by 18 column array. The code symbols are read and written by column. That is, the code symbols are read from buffer 72 in the same order in which they were written. When the sixth symbol of a packet has been received, IB 48 may then begin sending VD 50 a triplet of code symbols (representing a single original data bit) during every process cycle until the full packet has been processed. After reset and after the end of each buffer cycle, the DBR-selected bits on decoder input 34 are continuously clocked by the internal clock into a DBR code register (not shown). The fourteen bits ending with DBR-13 at the strobe on DECSYNC line 70 are latched as the DBRCODE word for the next buffer cycle. These DBRCODE bits, DBR-0 to DBR-13, are used to select code symbols to be written to repeat buffer 78 from the full rate symbols sent to VD 50 over bus 52. Once the full packet has been processed, the half-sized packet remaining in repeat buffer 78 is then processed similarly. As the code symbols for the half-sized packet are sent to VD 50 over bus 52, those symbols selected by the DBRCODE are rewritten into repeat buffer as a fourth-size packet. The fourth-size and subsequent eighth-size packets are similarly processed.

FIG. 8 shows the DBRCODE symbol selection algorithm used to determine which 16 slots (row pairs) are used from buffer 72. For full rate operation, all 16 slots (32 rows) are transmitted. However, the transmitter was turned off during the transmission time for some of the slots at the lower rates. For example, the fourth-rate sends only one of the first four slots as the first 36 code symbols. The code symbols are transmitted by row but the deinterleaver sends them to SVD 20 by column. Since the transmit DBR algorithm skips rows in the interleaver, the fractional rates effectively have fewer rows. For the DBR ¼ rate, buffer 72 contains only eight rows of data and noise symbols in the remainder of the rows. In contrast to reverse link traffic, the reverse link access channel (FIG. 3E) operates in repeat mode at a ⅓ convolution code rate with code symbols repeated twice to provide about 2.5 dB gain over the reverse traffic channel. The transmit DBR algorithm can be better appreciated with reference to the above-cited Gilhousen, et al patent application.

In addition to the functional logic illustrated in FIG. 7, IB 48 also contains test logic to permit a self-test verification of function.

The Viterbi Decoder (VD) Element of this Invention

FIG. 9 provides the functional block diagram for VD 50, which processes the code symbols arriving on bus 52 from IB 48. VD 50 outputs a decoded bit stream on rdata line 56 together with quality information. These functions are performed in the six submodules shown in FIG. 9. Two bits from DECMODE bus 68 control VD 50 operation on a DECRATE line 84 and a PACKET line 86. The data table stored in Symbol Metric Table (SMT) 88 is a programmable lookup table that converts the 7-bit code symbols on bus 52 to the proper 4-bit scale for correct operation of the branch metric logic 90. SMT 88 provides flexibility needed to handle different operating modes. The control information to VD 50 is normally set at the beginning of a packet processing call and is not changed during traffic reception. The DECRATE signal on line 84 determines how many code symbols are included in the branch metric calculation and the PACKET signal on line 86 causes the state metric values to be cleared at the beginning of each packet. The contents of SMT 88 are used to convert the 4, 5, 6 and 7-bit input code symbols on bus 52 into scaled four-bit output code symbols for branch metric logic 90 on an internal SMTSYM bus 92. These conversions include the necessary compensation for the doubling, quadrupling and octupling of the code symbols accumulated in IB 48 for the lower data rate packets. Each code symbol input on bus 52 provides the low-order address bits for SMT 88 and the data at such address are then output as the SMTSYM value on bus 92. SMT 88 stores a separate datum for each of the four rates in both repeat and DBR modes.

For each packet, VD 50 keeps track of a quality bit representing the Yamamoto Quality Metric (YQM). The quality bit for the best state (zero by definition) of the last process cycle of each packet size is stored in a YQM register 93 and is used later in determining the original data transmission rate.

A Symbol Error Rate (SER) logic 94 compares the input i and j symbol hard decisions with c0 and c1 values from re-encoded output data to create a SER byte for each packet on the SERROR bus 96. The value on bus 96 is saturated at 255 and is also used later in determining the original data transmission rate.

SMT 88 consists of a random-access memory (RAM) and load control logic to multiplex a write address and write strobes to the RAM. The 7-bit input symbol on SYMBUF bus 52 is used for the LSBs of the address for a 4-bit data value that becomes the output symbol at SMTSYM bus 92. The psize value on psize bus 98 forms the two MSBs of the RAM address and can select different conversions for the different packets to compensate for the accumulation sums introduced by IB 48.

The branches of the trellis (FIG. 6A) upon which the Viterbi decoder operates are labeled by the pairs $(c_0, c_1)$ for rate ½ code and by the triplets $(c_0, c_1, c_2)$ for rate ⅓ convolutional code. Thus, before any ACS operation, the proper branch metrics for each of the two possible values for $(c_0, c_1)$ or the three possible values $(c_0, c_1, c_2)$ for rate ½ and ⅓, respectively, must be computed. These branch metrics are computed according to Eqn. 1 below. For instance, during each calculation cycle, branch metric logic 90 generates a new pair of metrics $R_{ijk}$ on a BMETRIC bus 100. These are calculated from the input symbol (r2, r1, r0) on SMTSYM bus 92 and the hypotheses for the transmitted symbol (c2, c1, c0) on the hyp bus 102 from the timing control logic 104.

$$R_{ijk} = \sum_{ijk} [\overline{(r_{x3} \oplus c_x)} * (4*r_{x2} + 2*r_{x1} + r_{x0})] \qquad [\text{Eqn. 1}]$$

where: $c_x$ is the i, j or k hypothesis on bus 102 for the target ACS state, $r_{x3}$ is the sign of each code symbol on bus 92, and $(r_{x2}, r_{x1}, r_{x0})$ are the three LSBs of each symbol metric on SMTSYM bus 92.

Each of three symbol metrics on bus 92 representing a single original data bit are strobed into a set of input latches (not shown) in branch metric logic 90. The two (or three)

code symbols of input information are transformed for decoding rate ½ (or ⅓) to provide four-bit branch metric pairs on bus 100. The third symbol on bus 92 is forced to zero if DECRATE line 84 specifies a convolutional coding rate of ½. The branch metric pairs on bus 100 are presented to a Add-Compare-Select (ACS) logic 106, wherein one of the two branch metrics is selected during each ACS calculation cycle. For each hypothesis about the input data, the 4-bit branch metric on bus 100 is calculated according to Eqn. 1. A 4-bit branch metric is also generated for the complement of the hypothesis. In this formula, if the code symbol sign matches the hypothesis, the magnitude of the code symbol is added to the $R_{ijk}$ metric; otherwise, zero is added to the metric. The rate ½ branch metric values are expected to range from zero to 14 and the rate ⅓ branch metrics are expected to range from zero to 15. The ACS logic branch metric adder saturates at 15.

Symbol metrics on bus 92 from SMT 88 into branch metric logic 90 are expressed in a sign-magnitude format and erasures are determined by the symbol value according to the following exemplary lookup table.

| Rate ⅓ Symbol Metrics | | Rate ½ Symbol Metrics | |
| --- | --- | --- | --- |
| Strongest One | 0101 | Strongest One | 0111 |
| Weakest One | 0001 | Weakest One | 0001 |
| Erasure | 0000 | Erasure | 0000 |
| Erasure | 1000 | Erasure | 1000 |
| Weakest Zero | 1001 | Weakest Zero | 1001 |
| Strongest Zero | 1101 | Strongest Zero | 1111 |

If symbol metrics outside the expected range for rate ⅓ overflow the adders, the branch metrics on bus 100 saturate at 15 ($1111_2$).

The ACS logic 106 processes the input branch metrics on bus 100 during every calculation cycle for which it is enabled. A pair of ACS logic blocks 108 process the 4-bit branch metrics on bus 100 and the five-bit state metrics from the state RAM 110 to produce a pair of decision bits on an internal bus 112 and a new pair of state metrics on another internal bus 114. The decision bits on bus 112, which are the LSBs of the best previous state into each of ACS pair 108, are shifted into an 8-bit output latch 116. The 8-bit decision byte from every four decision pairs is output on a decisions bus 118 to the chainback logic 120.

During the first process cycle for each packet, the metric for the zero state is set to zero and all other metrics are set to their saturation value as they are read from state RAM 110. The decisions on bus 118 and the best states on bus 122 are forced to zero in the packet mode for the first eight process cycles of each frame. The new state metrics, the smallest sums of prior state metric and linking branch metric, are written back into state RAM 110 at a location calculated by shifting the current state from MSB to LSB. The zero hypothesis decision is chosen for equal metrics. The new metric for state zero is written into the best state latch 124 at the beginning of each process cycle. All other new state metrics in the current process cycle are compared against the current best state in latch 124 and a smaller metric replaces the current best state metric in latch 24. The best state metric from the previous process cycle is subtracted from each state metric as it is read from state RAM 110 during the current process cycle. ACS logic 106 continues to accumulate and normalize metrics until all four code symbol packets are processed.

A Yamamoto Quality Metric (YQM) or "qbit" is attached to each state metric. The YQM bit for initial state zero is set "good" or true (0) and all other YQM bits are set "bad" or false (1) during the first IB process cycle. The YQM bit is set false (1) for each new state metric calculated by ACS logic 106 if the YQM bit for the selected previous state metric was false or if the metric difference in the ACS calculation is less than or equal to the predetermined Quality Threshold (QT) value specified in a quality threshold register (see MUX 216 in FIG. 11).

An important element of this invention is the set of "error metrics" produced during decoding, including three types of quality information. For the several data rate hypotheses (e.g., 9600, 4800, etc.), SVD 20 creates one or more independent quality metric elements. These include the Cyclic Redundancy Check (CRC) results, the Symbol Error Rate (SER) and the Yamamoto Quality Metric (YQM). The YQM is also denominated herein as "qbit". Some error metrics are omitted at lower data rates. The CRC and SER metrics are well-known in the art. The YQM metric can be understood with reference to the above-cited Yamamoto, et al paper and the discussion below in connection with FIG. 11. The error metrics are used to select the most-probable original transmission data rate using the method disclosed in the above-cited Butler, et al patent application.

Decoded symbol data is produced for each data rate hypothesis and stored in OB 54. The frame data for each hypothesis includes the three quality metric elements. The CRC element is discussed herein below in connection with FIG. 10. The SER element is discussed herein below in connection with SER 140 in FIG. 9. FIG. 11 shows a block diagram of a portion of ACS pair 108 (FIG. 9) that creates the YQM bit.

Returning to FIG. 6B, the branch metric from state x0 to state 0x is added to the x0 state metric to determine the first of two possible 0x state metrics. The second possible 0x state metric is found by adding the branch metric from state x1 to the x1 state metric value. The least of these two possible values is then assigned as the new 0x state metric value. This process is repeated for the 1x state and for all other states in that trellis column. The YQM bit is a label showing that the difference between the two 0x state metric values is less than a predetermined Quality Threshold (QT) or, that it follows another state which was less than the predetermined QT. In FIG. 11, the LSB of the ACS0x0 state is provided on line 210 and the YQM bit of the ACS0x1 state is provided on line 212. A QT threshold value group 214 is provided on a plurality of 4-bit buses to a multiplexer MUX 216. The psize bus 218 selects one of the QT group 214, depending on the current transmission data rate hypothesis. An important element of this invention is that each of the quality thresholds (QTs) in group 214 are programmable and can be adjusted individually or together to accommodate for different operating modes. Since different rate hypothesis may have different QTs, MUX 216 switches between alternative QT members of group 214.

Continuing with FIG. 11, the difference between the two ACS state metrics is computed and provided on bus 220 to a four-way XOR-gate 222. The decision bit on line 224 is used to select the most probable of the two metrics in multiplexer MUX 226 and to enable METODIF on bus 220. The output on line 228 from MUX 226 represents the state metric bit selected from buses 210 and 212. Output line 228 is ORed with the output of the comparator 230 on line 232 to produce the YQM bit on line 234. Comparator 230 compares the selected QT from group 214 with the state metric difference on bus 220 (after adjusting for sign in XOR-gate 222). YQM bit 234 is forwarded to YQM register 93 (Fig. 9).

The YQM bit is produced in this manner for the current state in the Viterbi trellis (FIG. 6A). The YQM procedure has the property that forces a "bad" YQM bit in any one state of the Viterbi trellis to propagate forward through the decision tree. YQM bit 234 is a label that indicates that the difference between the two incoming state metrics is more or less than a selected QT value. If this difference is greater than the QT value, the YQM bit is set to the YQM bit from the previous state. If the difference is less than the selected QT value, then the YQM bit of the new state is set to "bad" or "1". At the beginning of the decoding operation of any rate hypothesis, the zero Viterbi trellis state is labeled with "good" YQM bits ("0"s) and all other trellis states are labelled with "bad" YQM bits. At the end of the decoding procedure of the rate hypothesis, the frame is labeled either "good" or "bad" according to the YQM bit for the final zero state, which is stored in register 93 and output from ACS logic 106 (FIG. 9). Because each vocoder frame is completed with a string of eight zeros (00000000), the decoder knows that the correct final state for the frame is the zero state.

Chainback logic 120 contains a path memory 126 having 64 words of 256 decision bits each. Path memory 126 is read twice and then written once during every four calculation cycles. Thus, chainback logic 120 is able to write 256 bits into a single path memory word and to read a bit from each of 64 such path memory words during every process cycle. Chainback logic 120 includes a multiplexer 128, an address generator 130 and a plurality of data latches 132. Address generator 130 determines the address of the word to be written and the first chainback read of a process cycle starts at the previous write word.

The chainback process is accomplished by writing and reading path memory 126 in a self-determining sequence. The eight LSBs of the read address start with the best state on bus 122 for the latest decision word on bus 118. This bit address will be zero for the last word (because the best state inputs are forced to zero) and for the first eight words of each block cycle (because the decision and best state inputs are forced to zero therein). The decision stored at the bit address for each word read is shifted into the read address as the LSB for the bit address in the next read word. The eight LSBs of the read address that form the bit address into the decision word are rotated by one bit, to move the MSB (the eighth bit address) to the LSB position. This rotation compensates for the ordering of the decisions by ACS pair 108. Address generator 130 decrements the word address after each read to chain back from the newest to the oldest decision word in path memory 126. The decision bit at the $63^{rd}$ read is the bit output on the internal bit line 134 to output data latches 132. Each frame is processed through 432 process cycles, including 192 cycles for the full data rate, 96 cycles for the half data rate, 48 cycles for the quarter data rate and 24 cycles for the eighth data rate.

The chainback operation performs the same functions in both packet and continuous modes, except for the best-state control described above. The output bits on line 134 are clocked from chainback logic 120 on rdata line 56 . . . [as before].

Symbol Error Rate (SER) logic 94 re-encodes the output data stream on rdata line 56 and compares the regenerated code symbols with the code symbols received into SVD 20 on decode input line 34. The strobe on SYMSTB line 80 docks the sign bit r3 of each symbol metric on bus 92 into a First-In-First-Out (FIFO) 136, which compensates for the pipeline and chainback delays in VD 50. The encoder 138 and error counter 140 are reset at the beginning of each frame preparatory to the docking of each bit on line 56 into a 9-bit shift register in encoder 138. The number of code symbols that do not compare are counted in an 8-bit error counter 140, which saturates at 255. The output from counter 140 is provided on SERROR bus 96 to OB 54, where it is shifted and latched into the appropriate register.

Timing control logic 104 begins operation of VD 50 when it receives a signal on INBUFRDY line 66 and then coordinates the timing between the other elements of VD 50. Logic 104 originates two strobes (or three for rate ⅓) on SYMSTB line 80 to clock the data through SMT 88 into branch metric logic 90 and SER logic 94. During each calculation cycle, VD 50 processes the current original data bit symbol for one hypothesis on hyp bus 102 with ACS pair 108. A process cycle includes 128 calculation cycles to process each bit symbol for every ACS state. Because the convolution encoder constraint length for this embodiment is nine, there are $2^{9-1}=256$ states for every original data bit symbol (in each trellis column). A state sequence counter in timing control logic 104 counts through the 256 states (2 per calculation cycle), presenting the count on the STATESEQ bus 142. Other elements in timing control logic 104 encode the state register contents to generate the hypotheses on hyp bus 102. Other control signals are presented on ACSSTATE bus 144 to (a) idle the ACS processing and logic 106, (b) zero the state metric inputs to ACS pair 108 during the first process cycle, (c) flag the end of each process cycle so that the best state can be saved, and (d) enable decision latch 116 for every calculation cycle.

Timing control logic 104 determines the read and write addresses for path memory 126 and presents these on the address buses 146 and 148, respectively. An 11-bit counter (not shown) within logic 104 is incremented with each write to generate the write address for each decision byte on bus 118. One of the 32 writes of decision bytes on bus 118 occurs every four calculation cycles during a process cycle. The 6 MSBs of the read address on bus 146 are generated by the same logic that generates a read strobe and decrements the address twice between write strobes. Control signals required to load, shift and zero the LSBs of the read address on bus 146 are produced from the timing within logic 104. This same timing also determines a RSTB strobe signal on an RSTB line 150 for coordinating the operations of chainback logic 120 and SER logic 94. Timing and control logic 104 also generates timing signals for resetting and enabling error counter 140 within SER 94.

The Output Buffer (OB) Of This Invention

FIG. 10 shows the functional block diagram illustrating the output buffer (OB) 54. Decoded data on rdata bus 56 are converted to bytes in a converter logic 152 and stored in a buffer 154. Converter 152 also checks the packet CRC code in the usual manner. The packets and status bytes for the packets are available to microprocessor interface 58 on DECDATA bus 60 for about 10 milliseconds beginning with the issue of an interrupt to microprocessor interface 58 on the INTD line 156. The results of a CRC check on the packets is stored in a status register (not shown). The CRC polynomials used by converter 152 depend on the packet size as follows:

| Packet Size | CRC g(x) |
| --- | --- |
| 24 bit | none |
| 48 bit | none |
| 96 bit | CRC $x^8 + x^7 + x^4 + x^3 + x + 1$ |
| 192 bit | CRC $x^{12} + x^{11} + x^{10} +$ $x^9 + x^8 + x^4 + x + 1$ |

The CRCs used are of the form $g(x)=p(x)*(x+1)$ and known good primitive polynomials, $211_8$ ($89_{16}$) and $5361_8$ ($AF1_{16}$), are used for p(x).

The logic within converter 152 used for CRC checking is well-known in the art and consists of a shift register tapped in accordance with the CRC polynomial with the tap output accumulated through an XOR-gate.

When the frame has been processed four times in packet mode or once in continuous mode and the data for all four rates has been written into OB 54, the interrupt on line 156 is set to true (1). SVD 20 sequences through the same 432 process cycle sequence for each packet mode frame without regard for actual data rate or packet size. Thus, the interrupt on line 156 occurs at a fixed delay with respect to input code symbol strobes on line 64 (FIG. 7). In continuous mode, the fixed delay is dependent on actual packet size. The INTD interrupt on line 156 is reset automatically after seven internal CHIPX8 clock cycles. The microprocessor (not shown) can use this interrupt signal, or frame timing, to indicated when it should read the output data. Buffer 154 contains sufficient storage space for a full set of packets, thereby allowing a frame time less processing time, about 10 milliseconds, for the output data to be read via microprocessor interface 58 (FIG. 5). The last eight bits of each packet are zero in packet mode because SVD 20 is operating in a burst mode assuming the transmitting encoder was preset and flushed to the zero state. A DECDATA register (not shown) in buffer 154 is automatically updated with the next byte from buffer 154 after each read. The data are prefetch to minimize the microprocessor wait time for the next byte but the prefetch still requires at least four internal CHIPX8 clock cycles. If the microprocessor can read OB 54 faster than once every four internal CHIPX8 clock cycles, then the microprocessor must test the BYTERDY signal on the BYTERDY bus 158 to ensure that no output word is read twice. The Quality information ("error metrics") included in the output data can be used by the microprocessor to select the best packet from among the four available in OB 54 in accordance with the method of the above-cited Butler, et al patent application.

Converter 152 supplies a data byte to buffer 154 every 8 process cycles. The data is transferred over an internal bus 160 to buffer 154 at the beginning of the next process cycle. As each bit of data is received on line 56, it is clocked into a CRC generator (not shown) within converter 152. This CRC generator is reset to all ones at the beginning of each packet. At the end of 96 and 192 bit packets, the CRC remainder is checked and the CRC bit in the STATUS register (not shown) is set if the remainder is all zeros. The read data is prefetched before the interrupt on INTD line 156 is issued and after each read. When the INTD interrupt is issued on line 156, the read address pointer is set to address zero. The BYTERDY signal on line 158 is set to zero after each read and held there until the new data byte is latched into the DECDATA register (not shown) in buffer 154. OB 54 also contains test logic to permit self-testing for proper function.

The Controller and Processor Interface Elements Of This Invention

Referring to FIG. 5, controller 62 provides timing and control strobes for SVD 20. SVD 20 runs at the internal CHIPX8 clock rate and controller 62 provides a series of strobe and enabling signals based on this internal clock rate. These control signals can be initialized by a reset for testing purposes but, in normal operation, they sequence through a fixed set of operations responsive to the DECMODE signals on bus 68 and then return to an idle state. The control signal sequence begins again after each decoder synchronization strobe on line 70 (FIG. 7). A chain validation signal indicating valid chainback data operates to enable the RSTB strobe on line 150, which initializes data transfer to OB 54. Controller 62 and microprocessor interface 58 contain the microprocessor control registers necessary for proper operation, including the pin control and reset register. Special self-testing logic is also included in these two elements.

The actual implementation of the internal modules for each of the above described elements of SVD 20 can be accomplished in any useful manner known in the art but is preferably accomplished on a single monolithic integrated circuit chip.

Although the teaching, examples, and embodiment of this description presume serial processing to achieve the desired objectives, it will be manifest to those skilled in the art that the decoder logic can be replicated into multiple parallel decoders which operate concurrently to provide as many outputs as there are data rates in a transmission system.

The invention may also be varied, for example, by using cyclic redundancy coding for as many data rates as system considerations demand.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. A method of providing decoded bit data in response to a transmission of code symbol data which represents original bit data having a data rate $R_i$, where $R_i$ is one data rate of two or more predetermined original bit data rates, the method being executable using a decoder apparatus including an input buffer, a convolutional decoder, and an output buffer, the method including the steps of:

transmitting said code symbol data in frames of predetermined time duration wherein the transition between each said successive frame of said code symbol data is forced to a predetermined state;

receiving and storing successive portions of said transmission of said code symbol data in said input buffer; and decoding any portion of said successive portions in said convolutional decoder in two or more passes to obtain two or more rackets $\{P_i\}$ of decoded bit data, each packet $P_i$ being decoded during a respective pass of said two or more passes, each packet $P_i$ including:

decoded bit data $I_i$ corresponding to original bit data having said data rate $R_i$; and quality metric data $Q_i$ representing symbol error conditions in said any portion and data error conditions in said decoded bit data; and storing said two or more packets in said output buffer, wherein said quality metric data $Q_i$ representing data error conditions in each said frame of said decoded bit data includes:

a Quality Metric (QM) representing the results of a comparison between a predetermined Quality Threshold (QT) value and a measure of the probability of decoding said zero state at said each transition between successive frames of said decoded bit data.

2. A method of providing decoded bit data in response to a transmission of code symbol data which represents original bit data having a data rate $R_j$, where $R_j$ is one data rate of two or more predetermined original bit data rates, the method being executable using a decoder apparatus including an input buffer, a convolutional decoder, and an output buffer, the method including the steps of:

transmitting said code symbol data in frames of predetermined time duration wherein the transition between each said successive frame of said code symbol data is forced to a predetermined state;

receiving and storing successive portions of said transmission of said code symbol data in said input buffer; and decoding any portion of said successive portions in said convolutional decoder in two or more passes to obtain two or more packets $\{P_i\}$ of decoded bit data, each packet $P_i$ being decoded during a respective pass of said two or more passes, each packet $P_i$ including:

decoded bit data $I_i$ corresponding to original bit data having said data rate $R_i$; and quality metric data $Q_i$ representing symbol error conditions in said any portion and data error conditions in said decoded bit data; and storing said two or more packets in said output buffer, wherein said code symbol data representing said original bit data encoded according to a coding algorithm, the method further including the steps of recoding each of said at least two decoded bit data packets $\{P_i\}$ according to said coding algorithm to create a packet of local code symbol data $(L_i)$;

comparing said code symbol data with each of said at least two local code symbol data packets $\{L_i\}$ to produce a qualitative measure $(Q_i)$ of the number of differences there between; and storing at least two qualitative measures $\{Q_i\}$ in said output data buffer.

3. A method of providing decoded bit data in response to a transmission of code symbol data which represents original bit data having a data rate $R_i$, where $R_i$ is one data rate of two or more predetermined original bit data rates, the method being executable using a decoder apparatus including an input buffer, a convolutional decoder, and an output buffer, the method including the steps of:

transmitting said code symbol data in frames of predetermined time duration wherein the transition between each said successive frame of said code symbol data is forced to a predetermined state;

receiving and storing successive portions of said transmission of said code symbol data in said input buffer; and decoding any portion of said successive portions in said convolutional decoder in two or more passes to obtain two or more packets $\{P_i\}$ of decoded bit data, each packet $P_i$ being decoded during a respective pass of said two or more passes, each packet $P_i$ including:

decoded bit data $I_i$ corresponding to original bit data having said data rate $R_i$; and quality metric data $Q_i$ representing symbol error conditions in said any portion and data error conditions in said decoded bit data; and storing said two or more packets in said output buffer, wherein frames of data having a first bit data rate include packets of encoded data bits, each packet including cyclic redundancy check bits, the method comprising the additional unordered steps of:

determining an error rate for said packets of data bits using said cyclic redundancy check bits;

producing a qualitative measure $(Q_i)$ indicating said error rate; and storing at least two qualitative measures $\{Q_i\}$ in said output buffer.

4. In a communication system in which original bit data, provided at one of a first plurality of predetermined original bit data rates $\{R_i\}$, is encoded to provide code symbol data, and wherein said code symbol data is provided in frames comprising code symbol data when said original bit rate is less than a predetermined maximum data rate and wherein said frames comprise said first version of said coded symbol data when said original bit rate is said predetermined maximum data rate, a method for decoding said code symbol data comprising the steps of:

(a) receiving and storing code symbol data in an input data buffer;

(b) decoding said code symbol data in at least two passes to create in each pass a packet $(P_i)$ of said decoded bit data corresponding to a respective one of at least two of said first plurality of predetermined original bit data rates $\{R_i\}$; and (c) storing said at least two decoded bit data packets $\{P_i\}$ in an output data buffer;

(d) recoding each of said at least two decoded bit data packets $\{P_i\}$ according to said first coding algorithm to create a packet of local code symbol data $(L_i)$;

(e) comparing said code symbol data with each of said at least two local code symbol data packets $\{L_i\}$ to create a qualitative measure $(Q_i)$ of the number of differences therebetween; and (f) storing each of said at least two qualitative measures $\{Q_i\}$ in said output data buffer.

5. The method of claim 4 wherein said sequential decoding step (b) comprises the steps of:

(b.1) assigning at least one symbol metric value to each of said code symbol data in accordance with a second coding algorithm;

(b.2) assigning branch metric values representing the original data bit transition probability corresponding to each said code symbol datum in accordance with selected ones of said symbol metric values;

(b.3) assigning state metric values representing the original data bit transition probability corresponding to said code symbol datum in accordance with the sum of the most probably preceding said state metric value and said branch metric value therefrom;

(b.4) storing said state metric values in a path memory; and (b.5) selecting the most probable value for each said original data bit in accordance with the most probable said state metric value corresponding to a decision path chain preceding the most probable said state metric value corresponding to said each code symbol in said path memory.

6. The method of claim 5 wherein said code symbol data provided to said input buffer comprises a first version and $(N_i-1)$ repeated versions of code symbol data when said original bit rate is less than a predetermined maximum data rate.

7. The method of claim 5 wherein ones of the first version of said coded symbol data and said $(N-1)$ repeated versions of said coded symbol data are deleted to provide to said input buffer said code symbol data containing one remaining version of said coded symbol data.

8. The method of claim 4 wherein said decoding step (b) comprises the steps of:

(b.1) assigning at least one symbol metric value to each of said code symbol data in accordance with a second coding algorithm;

(b.2) assigning branch metric values representing the original data bit transition probability corresponding to each said code symbol datum in accordance with selected ones of said symbol metric values;

(b.3) assigning state metric values representing the original data bit transition probability corresponding to said code symbol datum in accordance with the sum of the most probably preceding said state metric value and said branch metric value therefrom;

(b.4) storing said state metric values in a path memory; and (b.5) selecting the most probable value for each said original data bit in accordance with the most probable state metric value corresponding to a decision path chain preceding the most probable said state metric value corresponding to said each code symbol in said path memory.

9. The method of claim 8 wherein said code symbol data provided to said input buffer comprises a first version and $(N_r-1)$ repeated versions of code symbol data when said original bit rate is less than a predetermined maximum data rate.

10. The method of claim 8 wherein ones of the first version of said coded symbol data and said (N-1) repeated versions of said coded symbol data are deleted to provide to said input buffer said code symbol data containing one remaining version of said coded symbol data.

11. The method of claim 4 wherein said code symbol data provided to said input buffer comprises a first version and $(N_r-1)$ repeated versions of code symbol data when said original bit rate is less than a predetermined maximum data rate.

12. The method of claim 4 wherein ones of the first version of said coded symbol data and said (N-1) repeated versions of said coded symbol data are deleted to provide to said input buffer said code symbol data containing one remaining version of said coded symbol data.

13. The method of claim 4 wherein said code symbol data provided to said input buffer comprises a first version and $(N_r-1)$ repeated versions of code symbol data when said original bit rate is less than a predetermined maximum data rate.

14. The method of claim 4 wherein ones of the first version of said coded symbol data and said (N-1) repeated versions of said coded symbol data are deleted to provide to said input buffer said code symbol data containing one remaining version of said coded symbol data.

15. In a communication system in which original bit data, provided at one of a first plurality of predetermined original bit data rates $\{R_i\}$, is encoded to provide code symbol data, and wherein said code symbol data is provided in frames comprising a first version and $(N_r-1)$ repeated versions of code symbol data when said original bit rate is less than a predetermined maximum data rate and wherein said frames comprise said first version of said coded symbol data when said original bit rate is said predetermined maximum data rate, wherein a multirate decoder for creating decoded bit data corresponding to said first version of said coded original bit data at an output, said multirate decoder comprising:

input buffer means for accepting and storing said code symbol data;

decoder means coupled to said input buffer means for decoding said code symbol data in at least two passes to create in each pass a packet $(P_i)$ of decoded bit data corresponding to a respective one of at least two said predetermined original bit data rates $\{R_i\}$ responsive to said code symbol data;

output buffer means couvled to said sequential decoder means for storing said at least two packets $\{P_i\}$ of said decoded bit data;

symbol transfer means in said input buffer means for selecting a set $(S_i)$ of said code symbol data corresponding to said first version of said coded original bit data for each of at least two of said predetermined original bit data rates $\{R_i\}$ and for transferring said set $(S_i)$ to said sequential decoder means; and quality metric means in said decoder means for creating a quality measure $(Q_i)$ for each said decoded bit data packet $(P_i)$, said quality measure $(Q_i)$ representing the number of code symbol data errors associated with said each decoded data bit packet $(P_i)$, wherein said decoder means comprises:

symbol metric means for assigning a symbol metric value to each said code symbol in accordance with a second coding algorithm;

branch metric calculator means coupled to said symbol metric means for creating a pair of branch metric values representing the weighted probability for an original data bit transition corresponding to said each code symbol from said input buffer means, responsive to the corresponding said symbol metric value;

decision path means coupled to said branch metric calculator means for creating and storing a state metric decision value for each possible original data bit transition corresponding to said each code symbol from said input buffer means, responsive to the corresponding said branch metric values; and path chain-back means coupled to said decision path means for selecting the most probable decision path for each said original data bit transition and for creating a corresponding said decoded data bit.

16. In a communication system in which original bit data, provided at one of a first plurality of predetermined original bit data rates $\{R_i\}$, is encoded to provide code symbol data, and wherein said code symbol data is provided in frames comprising a first version and $(N_r-1)$ repeated versions of code symbol data when said original bit rate is less than a predetermined maximum data rate and wherein said frames comprise said first version of said coded symbol data when said original bit rate is said predetermined maximum data rate, wherein a multirate decoder for creating decoded bit data corresponding to said first version of said coded original bit data at an output, said multirate decoder comprising:

input buffer means for accepting and storing said code symbol data;

decoder means coupled to said input buffer means for decoding said code symbol data in at least two passes to create in each pass a packet $(P_i)$ of decoded bit data corresponding to a respective one of at least two said predetermined original bit data rates $\{R_i\}$ responsive to said code symbol data;

output buffer means coupled to said sequential decoder means for storing said at least two packets $\{P_i\}$ of said decoded bit data;

symbol transfer means in said input buffer means for selecting a set $(S_i)$ of said code symbol data corresponding to said first version of said coded original bit data for each of at least two of said predetermined original bit data rates $\{R_i\}$ and for transferring said set $(S_i)$ to said sequential decoder means; and quality metric means in said decoder means for creating a quality measure $(Q_i)$ for each said decoded bit data packet $(P_i)$, said quality measure $(Q_i)$ representing the number of code symbol data errors associated with said each decoded data bit packet $(P_i)$, wherein said multirate decoder is embodied essentially in a single monolithic integrated circuit.

17. A multi rate decoder for decoding code symbol data received at an input to yield decoded bit data at an output, where said code symbol data represent original bit data according to a first coding algorithm, said code symbol data being transmitted at a rate equivalent to one of a first plurality of predetermined original bit data rates $\{R_i\}$, wherein said code symbol data comprises a representation of said original bit data according to a first coding algorithm when said original bit rate is a predetermined maximum and wherein said code symbol data represents a first version and $(N_i-1)$ repeated versions of coded original bit data, where $N_i$ and i are non-zero positive integers, said multirate sequential decoder comprising:

input buffer means coupled to said input for accepting and storing code symbol data;

decoder means coupled to said input buffer means for decoding said code symbol in at least two passes to create, in each pass a packet $(P_i)$ of said decoded bit data corresponding to a respective one of at least two said predetermined original bit data rates $\{R_i\}$ responsive to said code symbol data;

output buffer means coupled to said output and to said sequential decoder means for storing said at least two decoded bit data packets $\{P_i\}$;

first selection means coupled to said input buffer means for selecting one of a plurality of decoding modes each corresponding to a different said first coding algorithm; and second selection means coupled to said input buffer means for selecting one of said first and second channel modes corresponding to continuous and framed original bit data.

18. The multirate decoder of claim 17 further comprising:

symbol transfer means in said input buffer means for selecting a set $(S_i)$ of said code symbol data corresponding to said first version of said original bit data for each of at least two of said predetermined original bit data rates $\{R_i\}$ and for transferring said set $(S_i)$ to said sequential decoder means.

19. The method of claim 18 wherein said code symbol data provided to aid input buffer comprises a first version and $(N_i-1)$ repeated versions of code symbol data when said original bit rate is less than a predetermined maximum data rate.

20. The method of claim 18 wherein ones of the first version of said coded symbol data and said (N−1) repeated versions of said coded symbol data are deleted to provide to said input buffer said code symbol data containing one remaining version of said coded symbol data.

21. The multirate decoder of claim 18 further comprising:

quality metric means in said decoder means for creating a quality measure $(Q_i)$ for each said decoded bit data packet $(P_i)$, said quality measure $(Q_i)$ symbol data errors associated with said each decoded data bit packet $(P_i)$.

22. The multirate decoder of claim 21 wherein said quality metric means comprises:

data recoder means for recoding each of said at least two decoded bit data packets $\{P_i\}$ according to said first coding algorithm to create a packet of local code symbol data $(L_i)$; and comparison means coupled to said data recoder means for comparing each said local code symbol data packet $(L_i)$ with each said code symbol data set $(S_i)$ and for counting the number of differences therebetween.

23. The method of claim 21 wherein said code symbol data provided to said input buffer comprises a first version and $(N_i-1)$ repeated versions of code symbol data when said original bit rate is less than a predetermined maximum data rate.

24. The method of claim 21 wherein ones of the first version of said coded symbol data and said (N−1) repeated versions of said coded symbol data are deleted to provide to said input buffer said code symbol data containing one remaining version of said coded symbol data.

25. The multirate decoder of claim 22 wherein said decoder means comprises:

symbol metric means for assigning a symbol metric value to each said code symbol in accordance with a second coding algorithm;

branch metric calculator means coupled to said symbol metric means for creating a pair of branch metric values representing the weighted probability for an original data bit transition corresponding to said each code symbol from said input buffer means, responsive to the corresponding said symbol metric value;

decision path means coupled to said branch metric calculator means for creating and storing a state metric decision value for each possible original data bit transition corresponding to said each code symbol from said input buffer means, responsive to the corresponding said branch metric values; and path chain-back means coupled to said decision path means for selecting the most probable decision path for each said original data bit transition and for creating a corresponding said decoded data bit.

26. The method of claim 22 wherein said code symbol data provided to said input buffer comprises a first version and $(N_i-1)$ repeated versions of code symbol data when said original bit rate is less than a predetermined maximum data rate.

27. The method of claim 22 wherein ones of the first version of said coded symbol data and said (N−1) repeated versions of said coded symbol data are deleted to provide to said input buffer said code symbol data containing one remaining version of said coded symbol data.

28. The multirate decoder of claim 25 embodied essentially in a single monolithic integrated circuit.

29. The method of claim 25 wherein said code symbol data provided to said input buffer comprises a first version and $(N_i-1)$ repeated versions of code symbol data when said original bit rate is less than a predetermined maximum data rate.

30. The method of claim 25 wherein ones of the first version of said coded symbol data and said (N−1) repeated versions of said coded symbol data are deleted to provide to said input buffer said code symbol data containing one remaining version of said coded symbol data.

31. The method of claim 17 wherein ones of the first version of said coded symbol data and said (N−1) repeated versions of said coded symbol data are deleted to provide to said input buffer said code symbol data containing one remaining version of said coded symbol data.

32. The method of claim 28 wherein said code symbol data provided to said input buffer comprises a first version and $(N_i-1)$ repeated versions of code symbol data when said original bit rate is less than a predetermined maximum data rate.

33. The method of claim 28 wherein ones of the first version of said coded symbol data and said (N−1) repeated versions of said coded symbol data are deleted to provide to said input buffer said code symbol data containing one remaining version of said coded symbol data.

27

34. The multirate decoder of claim 17 further comprising:
quality metric means in said sequential decoder means for creating a quality measure ($Q_i$) for each said decoded bit data packet ($P_i$), said quality measure ($Q_i$) symbol data errors associated with said each decoded data bit packet ($P_i$).

35. The multirate decoder of claim 34 wherein said quality metric means comprises:
data recoder means for recoding each of said at least two decoded bit data packets {$P_i$} according to said first coding algorithm to create a packet of local code symbol data ($L_i$); and
comparison means coupled to said data recoder means for comparing each said local code symbol data packet ($L_i$) with each said code symbol data set ($S_i$) and for counting the number of differences therebetween.

36. The method of claim 34 wherein said code symbol data provided to said input buffer comprises a first version and ($N_i-1$) repeated versions of code symbol data when said original bit rate is less than a predetermined maximum data rate.

37. The method of claim 34 wherein ones of the first version of said coded symbol data and said (N-1) repeated versions of said coded symbol data are deleted to provide to said input buffer said code symbol data containing one remaining version of said coded symbol data.

38. The method of claim 35 wherein said code symbol data provided to said input buffer comprises a first version and ($N_i-1$) repeated versions of code symbol data when said original bit rate is less than a predetermined maximum data rate.

39. The method of claim 35 wherein ones of the first version of said coded symbol data and said (N-1) repeated versions of said coded symbol data are deleted to provide to said input buffer said code symbol data containing one remaining version of said coded symbol data.

40. The multirate decoder of claim 17 wherein said decoder means comprises:
symbol metric means for assigning a symbol metric value to each said code symbol in accordance with a second coding algorithm;
branch metric calculator means coupled to said symbol metric means for creating a pair of branch metric values representing the weighted probability for an original data bit transition corresponding to said each code symbol from said input buffer means, responsive to the corresponding said symbol metric value;
decision path means coupled to said branch metric calculator means for creating and storing a state metric decision value for each possible original data bit transition corresponding to said each code symbol from said input buffer means, responsive to the corresponding said branch metric values; and
path chain-back means coupled to said decision path means for selecting the most probable decision path for each said original data bit transition and for creating a corresponding said decoded data bit.

41. The multirate decoder of claim 17 embodied essentially in a single monolithic integrated circuit.

42. The method of claim 17 wherein said code symbol data provided to said input buffer comprises a first version and ($N_i-1$) repeated versions of code symbol data when said original bit rate is less than a predetermined maximum data rate.

43. In a communication system in which original bit data, provided at one of a first plurality of predetermined original bit data rates {$R_i$}, is encoded to provide code symbol data, and wherein said code symbol data is provided in frames comprising a first version and ($N_i-1$) repeated versions of code symbol data when said original bit rate is less than a predetermined maximum data rate and wherein said frames comprise said first version of said coded symbol data when said original bit rate is said predetermined maximum data rate, wherein a multirate decoder for creating decoded bit data corresponding to said first version of said coded original bit data at an output, said multirate decoder comprising:
input buffer means for accepting and storing said code symbol data;
decoder means coupled to said input buffer means for decoding said code symbol data in at least two passes to create in each pass a packet ($P_i$) of decoded bit data corresponding to a respective one of at least two said predetermined original bit data rates {$R_i$} responsive to said code symbol data;
output buffer means coupled to said sequential decoder means for storing said at least two packets {$P_i$} of said decoded bit data;
symbol transfer means in said input buffer means for selecting a set ($S_i$) of said code symbol data corresponding to said first version of said coded original bit data for each of at least two of said predetermined original bit data rates {$R_i$} and for transferring said set ($S_i$) to said sequential decoder means; and
quality metric means in said decoder means for creating a quality measure ($Q_i$) for each said decoded bit data packet ($P_i$), said quality measure ($Q_i$) representing the number of code symbol data errors associated with said each decoded data bit packet ($P_i$),
wherein said quality metric means comprises:
data recoder means for recoding each of said at least two decoded bit data packets {$P_i$} according to said first coding algorithm to create a packet of local code symbol data ($L_i$); and
comparison means coupled to said data recoder means for comparing each said local code symbol data packet ($L_i$) with each said code symbol data set ($S_i$) and for counting the number of differences therebetween.

44. The multirate decoder of claim 43 wherein said decoder means comprises:
symbol metric means for assigning a symbol metric value to each said code symbol in accordance with a second coding algorithm;
branch metric calculator means coupled to said symbol metric means for creating a pair of branch metric values representing the weighted probability for an original data bit transition corresponding to said each code symbol from said input buffer means, responsive to the corresponding said symbol metric value;
decision path means coupled to said branch metric calculator means for creating and storing a state metric decision value for each possible original data bit transition corresponding to said each code symbol from said input buffer means, responsive to the corresponding said branch metric values; and
path chain-back means coupled to said decision path means for selecting the most probable decision path for each said original data bit transition and for creating a corresponding said decoded data bit.

45. The method of claim 44 wherein said code symbol data provided to said input buffer comprises a first version and ($N_r$–1) repeated versions of code symbol data when said original bit rate is less than a predetermined maximum data rate.

46. The method of claim 44 wherein ones of the first version of said coded symbol data and said (N–1) repeated versions of said coded symbol data are deleted to provide to said input buffer said code symbol data containing one remaining version of said coded symbol data.

47. The multirate decoder of claim 44 embodied essentially in a single monolithic integrated circuit.

48. The method of claim 47 wherein said code symbol data provided to said input buffer comprises a first version and ($N_r$–1) repeated version of code symbol data when said original bit rate is less than a predetermined maximum data rate.

49. The multirate decoder of claim 43 further comprising:

quality metric means in said decoder means for creating a quality measure ($Q_i$) for each said decoded bit data packet ($P_i$), said quality measure ($Q_i$) symbol data errors associated with said each decoded data bit packet ($P_i$).

50. The multirate decoder of claim 49 wherein said quality metric means comprises:

data recoder means for receding each of said at least two decoded bit data packets ($P_i$) according to said first coding algorithm to create a packet of local code symbol data ($L_i$); and comparison means coupled to said data recoder means for comparing each said local code symbol data packet ($L_i$) with each said code symbol data set ($S_i$) and for counting the number of differences therebetween.

51. The method of claim 50 wherein said code symbol data provided to said input buffer comprises a first version and ($N_r$–1) repeated versions of code symbol data when said original bit rate is less than a predetermined maximum data rate.

52. The method of claim 50 wherein ones of the first version of said coded symbol data and said (N–1) repeated versions of said coded symbol data are deleted to provide to said input buffer said code symbol data containing one remaining version of said coded symbol data.

53. The method of claim 43 wherein ones of the first version of said coded symbol data and said (N–1) repeated versions of said coded symbol data are deleted to provide to said input buffer said code symbol data containing one remaining version of said coded symbol data.

54. In a communication system in which original bit data, provided at one of a first plurality of predetermined original bit data rates {$R_i$}, is encoded to provide code symbol data, and wherein said code symbol data is provided in frames comprising a first version and ($N_r$–1) repeated versions of code symbol data when said original bit rate is less than a predetermined maximum data rate and wherein said frames comprise said first version of said coded symbol data when said original bit rate is said predetermined maximum data rate, wherein a multirate decoder for creating decoded bit data corresponding to said first version of said coded original bit data at an output, said multirate decoder comprising:

input buffer means for accepting and storing said code symbol data;

decoder means coupled to said input buffer means for decoding said code symbol data in at least two passes to create in each pass a packet ($P_i$) of decoded bit data corresponding to a respective one of at least two said predetermined original bit data rates {$R_i$} responsive to said code symbol data;

output buffer means coupled to said sequential decoder means for storing said at least two packets {$P_i$} of said decoded bit data;

symbol transfer means in said input buffer means for selecting a set ($S_i$) of said code symbol data corresponding to said first version of said coded original bit data for each of at least two of said predetermined original bit data rates {$R_i$} and for transferring said set ($S_i$) to said sequential decoder means; and quality metric means in said decoder means for creating a quality measure ($Q_i$) for each said decoded bit data packet ($P_i$), said quality measure ($Q_i$) representing the number of code symbol data errors associated with said each decoded data bit packet ($P_i$), wherein said code symbol data provided to said input buffer comprises a first version and ($N_r$–1) repeated versions of code symbol data when said original bit rate is less than a predetermined maximum data rate.

55. In a communication system in which original bit data, provided at one of a first plurality of predetermined original bit data rates {$R_i$}, is encoded to provide code symbol data, and wherein said code symbol data is provided in frames comprising a first version and ($N_r$–1) repeated versions of code symbol data when said original bit rate is less than a predetermined maximum data rate and wherein said frames comprise said first version of said coded symbol data when said original bit rate is said predetermined maximum data rate, wherein a multirate decoder for creating decoded bit data corresponding to said first version of said coded original bit data at an output, said multirate decoder comprising:

input buffer means for accepting and storing said code symbol data;

decoder means coupled to said input buffer means for decoding said code symbol data in at least two passes to create in each pass a packet ($P_i$) of decoded bit data corresponding to a respective one of at least two said predetermined original bit data rates {$R_i$} responsive to said code symbol data;

output buffer means coupled to said sequential decoder means for storing said at least two packets {$P_i$} of said decoded bit data;

symbol transfer means in said input buffer means for selecting a set ($S_i$) of said code symbol data corresponding to said first version of said coded original bit data for each of at least two of said predetermined original bit data rates {$R_i$} and for transferring said set ($S_i$) to said sequential decoder means; and quality metric means in said decoder means for creating a quality measure ($Q_i$) for each said decoded bit data packet ($P_i$), said quality measure ($Q_i$) representing the number of code symbol data errors associated with said each decoded data bit packet ($P_i$), wherein ones of the first version of said coded symbol data and said (N–1) repeated versions of said coded symbol data are deleted to provide to said input buffer said code symbol data containing one remaining version of said coded symbol data.

56. In a communication system in which original bit data, provided at one of a first plurality of predetermined original bit data rates {$R_i$}, is encoded to provide code symbol data, and wherein said code symbol data is provided in frames comprising a first version and ($N_r$–1) repeated versions of code symbol data when said original bit rate is less than a predetermined maximum data rate and wherein said frames comprise said first version of said coded symbol data when said original bit rate is said predetermined maximum data rate, wherein a multirate decoder for creating decoded bit data corresponding to said first version of said coded original bit data at an output said multirate decoder comprising:

input buffer means for accepting and storing said code symbol data;

decoder means coupled to said input buffer means for decoding said code symbol data in at least two passes to create in each pass a packet ($P_i$) of decoded bit data corresponding to a respective one of at least two said predetermined original bit data rates $\{R_i\}$ responsive to said code symbol data;

output buffer means coupled to said sequential decoder means for storing said at least two packets $\{P_i\}$ of said decoded bit data;

symbol transfer means in said input buffer means for selecting a set ($S_i$) of said code symbol data corresponding to said first version of said coded original bit data for each of at least two of said predetermined original bit data rates $\{R_i\}$ and for transferring said set ($S_i$) to said sequential decoder means; and quality, metric means in said decoder means for creating a quality measure ($Q_i$) for each said decoded bit data packet ($P_i$), said quality measure ($Q_i$) representing the number of code symbol data errors associated with said each decoded data bit packet ($P_i$), wherein ones of the first version of said coded symbol data and said (N−1) repeated versions of said coded symbol data are deleted to provide to said input buffer said code symbol data containing one remaining version of said coded symbol data.

\* \* \* \* \*